United States Patent
Guo et al.

(10) Patent No.: US 9,716,453 B2
(45) Date of Patent: *Jul. 25, 2017

(54) MAGNETIC SENSOR AND AN INTEGRATED CIRCUIT

(71) Applicant: Johnson Electric S.A., Murten (CH)

(72) Inventors: Hui Min Guo, Hong Kong (CN); Shu Zuo Lou, Hong Kong (CN); Xiao Ming Chen, Hong Kong (CN); Guang Jie Cai, Hong Kong (CN); Chun Fai Wong, Hong Kong (CN); Yue Li, Hong Kong (CN); Chi Ping Sun, Hong Kong (CN); Bao Ting Liu, Shen Zhen (CN); En Hui Wang, Shen Zhen (CN); Fei Xin, Shen Zhen (CN); Shing Hin Yeung, Hong Kong (CN); Xiu Wen Yang, Shen Zhen (CN); Li Sheng Liu, Shen Zhen (CN); Yan Yun Cui, Shen Zhen (CN); Shu Juan Huang, Shen Zhen (CN)

(73) Assignee: JOHNSON ELECTRIC S.A., Murten (CH)

( * ) Notice: Subject to any disclaimer, the term of this patent is extended or adjusted under 35 U.S.C. 154(b) by 0 days.

This patent is subject to a terminal disclaimer.

(21) Appl. No.: 15/231,162

(22) Filed: Aug. 8, 2016

(65) Prior Publication Data

US 2016/0352263 A1    Dec. 1, 2016

Related U.S. Application Data

(63) Continuation-in-part of application No. 14/822,353, filed on Aug. 10, 2015.

(30) Foreign Application Priority Data

Aug. 8, 2014   (CN) .......................... 2014 1 0390592
Aug. 15, 2014  (CN) .......................... 2014 1 0404474
(Continued)

(51) Int. Cl.
H02K 29/08      (2006.01)
H02P 6/16       (2016.01)
(Continued)

(52) U.S. Cl.
CPC .............. *H02P 6/16* (2013.01); *G01D 5/145* (2013.01); *G01R 33/07* (2013.01); *H02K 11/215* (2016.01);
(Continued)

(58) Field of Classification Search
USPC ........ 318/400.38, 400.39; 324/207.2, 117 H, 324/123 R, 260, 529, 173, 179, 251–253,
(Continued)

(56) References Cited

U.S. PATENT DOCUMENTS 5,675,226 A      10/1997  Riola
8,542,010 B2 *    9/2013  Cesaretti .............. G01R 35/005
                                                      324/202
(Continued)

FOREIGN PATENT DOCUMENTS

CN     201409107 Y  *  2/2010
CN     201590796 U     9/2010
(Continued)

OTHER PUBLICATIONS

International Search Report mailed Oct. 19, 2015 in International Application No. PCT/CN2015/086422.

*Primary Examiner* — Jorge L Carrasquillo
(74) *Attorney, Agent, or Firm* — Pillsbury Winthrop Shaw Pittman LLP

(57) ABSTRACT

The present teaching relates to a magnetic sensor comprising an input port to be connected to an external power supply, a magnetic field detecting circuit configured to generate a magnet detection signal, an output control circuit configured to control operation of the magnetic sensor in response to the magnet detection signal, and an output port. The magnetic field detecting circuit includes a magnetic sensing element configured to detect an external magnetic field and output a detection signal, a signal processing element configured to amplify the detection signal and removing interference from the detection signal to generate processed detection signal, and an analog-digital conversion element configured to convert the processed detection signal into a magnet detection signal, and the output control circuit is configured to control the magnetic sensor to operate in at least one of a first state and a second state responsive to at least the magnet detection signal.

6 Claims, 23 Drawing Sheets

(30) Foreign Application Priority Data

| | | |
|---|---|---|
| Aug. 7, 2015 | (WO) | PCT/CN2015/086422 |
| Apr. 1, 2016 | (CN) | 2016 1 0204122 |
| Jun. 2, 2016 | (CN) | 2016 1 0388604 |

(51) Int. Cl.
*H02P 6/22* (2006.01)
*H02K 11/215* (2016.01)
*G01R 33/07* (2006.01)
*G01D 5/14* (2006.01)
*H02P 6/20* (2016.01)
*H02P 7/295* (2016.01)
*H02P 6/30* (2016.01)
*H02P 7/03* (2016.01)

(52) U.S. Cl.
CPC ............. *H02P 6/20* (2013.01); *H02P 6/22* (2013.01); *H02P 6/30* (2016.02); *H02P 7/05* (2016.02); *H02P 7/295* (2013.01); *H02P 2207/05* (2013.01)

(58) Field of Classification Search
USPC .................................. 324/248, 246
See application file for complete search history.

(56) References Cited

U.S. PATENT DOCUMENTS

| | | | |
|---|---|---|---|
| 2006/0132125 A1* | 6/2006 | Withanawasam | G01R 33/09 324/252 |
| 2012/0025817 A1* | 2/2012 | Romero | G01R 33/07 324/251 |
| 2013/0241534 A1* | 9/2013 | Schaerrer | G01R 15/185 324/117 H |

FOREIGN PATENT DOCUMENTS

| | | | |
|---|---|---|---|
| CN | 102075130 A | * | 5/2011 |
| DE | 102006055482 | | 6/2008 |

* cited by examiner (A) (B)

US 9,716,453 B2

MAGNETIC SENSOR AND AN INTEGRATED CIRCUIT

CROSS REFERENCE TO RELATED APPLICATIONS

This non-provisional patent application is a continuation-in-part of U.S. patent application Ser. No. 14/822,353, which claims priority to Chinese Patent Application No. 201410390592.2, filed on Aug. 8, 2014 and to Chinese Patent Application No. 201410404474.2, filed on Aug. 15, 2014. In addition, this non-provisional patent application claims priority under the Paris Convention to PCT Patent Application No. PCT/CN2015/086422, filed with the Chinese Patent Office on Aug. 7, 2015, to Chinese Patent Application No. CN201610204122.1, filed with the Chinese Patent Office on Apr. 1, 2016, and to Chinese Patent Application No. CN201610388604.7, filed with the Chinese Patent Office on Jun. 2, 2016 all of which are incorporated herein by reference in their entirety.

BACKGROUND

1. Technical Field

The present teaching relates to a field of circuit technology. In particular, the present teaching relates to a magnetic sensor. The present teaching further relates to a driver for a permanent magnetic motor.

2. Discussion of Technical Background

During starting of a synchronous motor, the stator produces an alternating magnetic field causing oscillation of a permanent magnetic rotor. The amplitude of the oscillation of the rotor increases until the rotor begins to rotate, and finally the rotor is accelerated to rotate in synchronism with the alternating magnetic field of the stator. To ensure the starting of a conventional synchronous motor, a starting point of the motor is set to be low, which results in that the motor cannot operate at a relatively high working point, thus the efficiency is low. In addition, the rotor cannot be ensured to rotate in a same direction every time as a stop or stationary position of the permanent magnetic rotor is not fixed. Accordingly, in applications such as a fan and water pump, the impeller driven by the rotor has straight radial vanes, which results in a low operational efficiency of the fan and water pump.

FIG. 1 illustrates a conventional drive circuit for a synchronous motor, which allows a rotor to rotate in a same predetermined direction every time when it starts. In the circuit, a stator winding 1 of the motor is connected in series with a TRIAC between two terminals M and N of an AC power source VM, and an AC power source VM is converted by a conversion circuit DC into a direct current voltage and the direct current is supplied to a position sensor H. A magnetic pole position of a rotor in the motor is detected by the position sensor H, and an output signal Vh of the position sensor H is connected to a switch control circuit PC to control the bidirectional thyristor T.

FIG. 2 illustrates waveforms at various locations of the drive circuit. It can be seen from FIG. 2 that, in the drive circuit, whether the bidirectional thyristor T is switched on or off, the AC power source supplies power for the conversion circuit DC so that the conversion circuit DC constantly outputs and supplies power for the position sensor H (referring to a signal VH in FIG. 2). In a low-power application, in a case that the AC power source provides commercial electricity of about 200V, the electric energy consumed by two resistors R2 and R3 in the conversion circuit DC is more than the electric energy consumed by the motor.

The magnetic sensor applies Hall effect, in which, when current I runs through a substance and a magnetic field B is applied in a positive angle with respect to the current I, a potential difference V is generated in a direction perpendicular to the direction of current I and the direction of the magnetic field B. The magnetic sensor is often implemented to detect the magnetic polarity of an electric rotor.

As the circuit design and signal processing technology advances, there is a need to improve the magnetic sensor and the implemented IC for the ease of use and accurate detection.

SUMMARY

The present teaching provides a magnetic sensor and application(s) thereof. According to an embodiment of the present teaching, a magnetic sensor comprises an input port to be connected to an external power supply; a magnetic field detecting circuit configured to generate a magnet detection signal; an output control circuit configured to control operation of the magnetic sensor in response to the magnet detection signal; and an output port, wherein the magnetic field detecting circuit includes a magnetic sensing element configured to detect an external magnetic field and output a detection signal, a signal processing element configured to amplify the detection signal and removing interference from the detection signal to generate processed detection signal, and a conversion element configured to convert the processed detection signal into the magnet detection signal, which is used to control the magnetic sensor to operate in at least one of a first state and a second state responsive to at least the magnet detection signal, wherein in the first state, a load current flows from the output port to outside of the magnetic sensor, and in the second state, a load current flows from the outside into the output port of the magnetic sensor.

In some embodiments, the detection signal includes a magnetic field signal and a deviation signal, and the signal processing element comprises a first chopper switch configured to separate the detection signal into the deviation signal and the magnetic field signal corresponding to a chopper frequency and a baseband frequency, respectively, a chopper amplifier configured to amplify the deviation signal and the magnetic field signal and to switch the amplified deviation signal and the amplified magnetic field signal onto the chopper frequency and the baseband frequency, respectively, and a filter circuit configured to filter out the deviation signal at the chopper frequency.

In some embodiments, the chopper amplifier comprises a first amplifier; and a second chopper switch, wherein the first amplifier is configured to perform first-stage amplification on the deviation signal and the magnetic field signal from the first chopper switch to generate the amplified deviation signal and the amplified magnetic field signal, respectively, and the second chopper switch is configured to switch the amplified deviation signal and the amplified magnetic field signal onto the chopper frequency and the baseband frequency, respectively.

In some embodiments, the first amplifier includes a folded cascode amplifier.

In some embodiments, the chopper amplifier further comprises a second amplifier connected in serial to the second chopper switch, wherein the second amplifier is configured to perform second-stage amplification on the amplified deviation signal switched onto the chopper frequency and the amplified magnetic field signal switched onto the baseband frequency.

In some embodiments, the signal processing element further comprises a sample-and-hold circuit coupled between the chopper amplifier and the filter circuit, wherein the sample-and-hold circuit is configured to sample a first pair of differential signals during a first half and a second half of a clock cycle, respectively and output two pairs of sampled differential signals during the clock cycle.

In some embodiments, the filter circuit further comprises a first filter configured to compute a second pair of differential signals based on the two pairs of sampled differential signals.

In some embodiments, the filter circuit further comprises a second filter configured to further amplify the second pair of differential signals, remove the deviation signal, and generate a third pair of differential signals.

In some embodiments, the conversion element comprises a first comparator configured to compare an output voltage determined based on the third pair of differential signals with a high-voltage threshold; a second comparator configured to compare the output voltage with a low-voltage threshold; and a latch logic circuit configured to output a first voltage if the output voltage is greater than the high-voltage threshold or a second voltage if the output voltage is less than the low-voltage threshold, or to maintain the output of the conversion element if the output voltage is between the low-voltage threshold and the high-voltage threshold, wherein the high-voltage threshold and the low-voltage threshold are determined based on the pair of differential voltage references, wherein the first comparator and the second comparator takes a third pair of differential signals from the filter circuit and a pair of differential voltage references as inputs.

In some embodiments, the latch logic circuit is configured to output a first voltage if a magnetic field intensity reaches a pre-set working point or a second voltage if the magnetic field intensity does not reach a pre-set releasing point, or to maintain the output of the conversion element if the magnetic field intensity is between the pre-set releasing point and the pre-set working point.

In some embodiments, the magnetic sensor further comprises a rectifying circuit coupled with the input port and configured to provide a voltage supply to the magnetic field detection circuit, and an output control circuit configured to control the magnetic sensor to operate in at least one of the first state and the second state based on the magnet detection signal, wherein the output control circuit comprises a first switch coupled with the output port to form a first current path allowing the load current flows from the output port to outside of the magnetic sensor in the first state; and a second switch coupled with the output port to form a second current path allowing the load current flows from outside of the magnetic sensor to the output port in the second state, wherein the first and second switches operate based on the magnet detection signal to selectively turn on the first and second current paths.

In some embodiments, wherein the first switch is a diode and the second switch is either a diode or a transistor.

According to another embodiment of the present teaching, an integrated circuit for a magnetic sensor comprises an input port to be connected to an external power supply; an output port; and a magnetic field detecting circuit configured to generate a magnet detection signal and comprises a magnetic sensing element configured to detect an external magnetic field and output a detection signal, wherein the detection signal includes a magnetic field signal and a deviation signal, a signal processing element configured to amplify the detection signal and remove interference to generate a processed detection signal, and a conversion element configured to convert the processed detection signal to the magnet detection signal, which is used to control the magnetic sensor to operate in at least one of a first state and a second state responsive to at least the magnet detection signal, wherein the signal processing element comprises a first chopper switch configured to separate the detection signal into a magnetic field signal and a deviation signal corresponding to a chopper frequency and a baseband frequency, respectively; a chopper amplifier configured to separately amplify the magnetic field signal and the deviation signal and switch the amplified deviation signal and the amplified magnetic field signal onto the chopper frequency and the baseband frequency, respectively, and a filter circuit configured to remove the deviation signal that has been switched to the chopper frequency.

According to another embodiment of the present teaching, a motor assembly comprises a motor coupled with an external power supply that provides alternating current (AC) power to the motor; a magnetic sensor configured to detect a magnetic field generated by the motor; and a bidirectional switch configured to control the motor based on an operating state of the magnetic sensor determined based on the detected magnetic field, wherein the magnetic sensor comprises a magnetic field detecting circuit configured to detect the magnetic field and generate a magnet detection signal based on the detected magnetic field; and an output control circuit configured to control, based on the magnet detection signal, the magnetic sensor to operate in at least one of a first state and a second state responsive to at least the magnet detection signal, wherein in the first state, current flows from outside of the magnetic sensor into the magnetic sensor, and in the second state, the current flows from the magnetic sensor to the outside of the magnetic sensor.

BRIEF DESCRIPTION OF THE DRAWINGS

The methods, systems, and/or programming described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, systems, components, and/or circuitry have been described at a relatively high-level, without detail, in order to avoid unnecessarily obscuring aspects of the present teachings.

Throughout the specification and claims, terms may have nuanced meanings suggested or implied in context beyond an explicitly stated meaning. Likewise, the phrase "in one embodiment/example" as used herein does not necessarily refer to the same embodiment and the phrase "in another embodiment/example" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1:
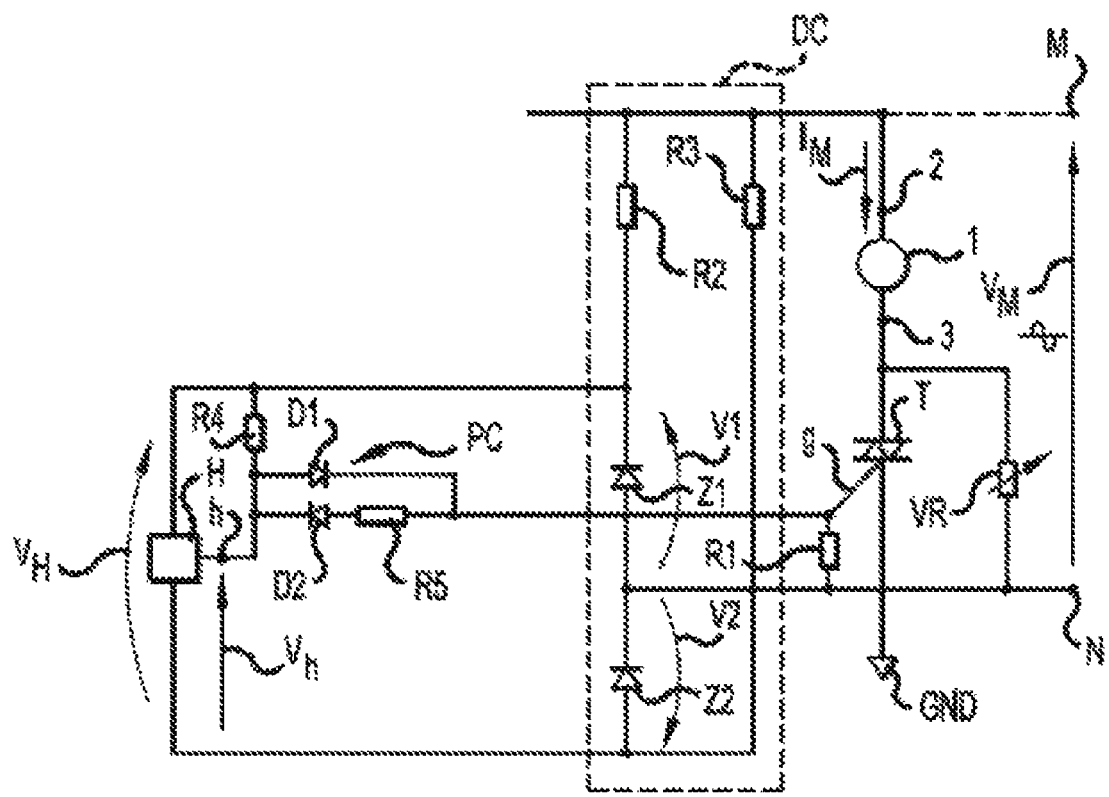
FIG. 1 illustrates a prior art drive circuit for a synchronous motor, according to an embodiment of the present teaching.
Figure 2:
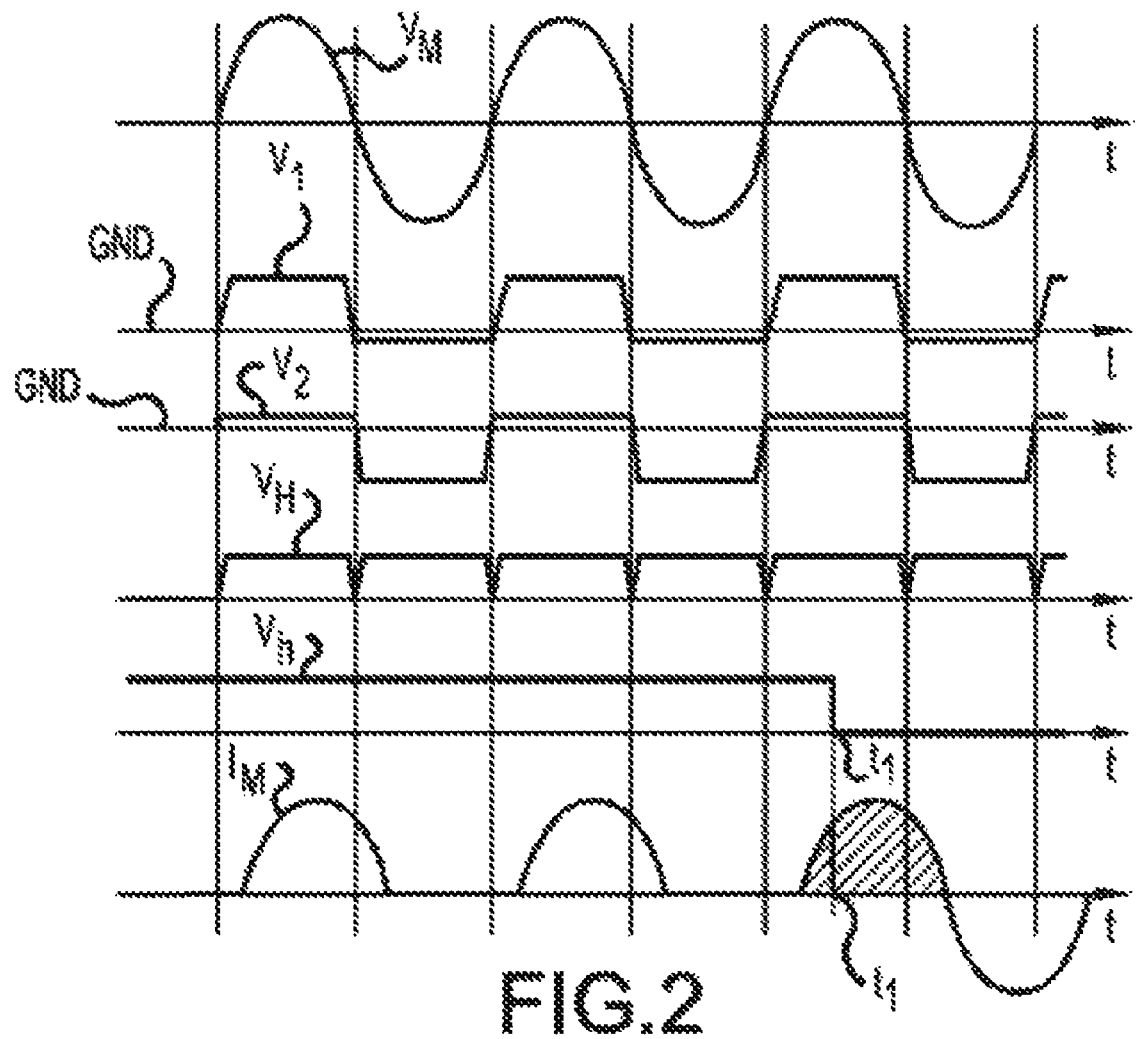
FIG. 2 illustrates waveforms at various locations of the drive circuit shown in FIG. 1.
Figure 3:
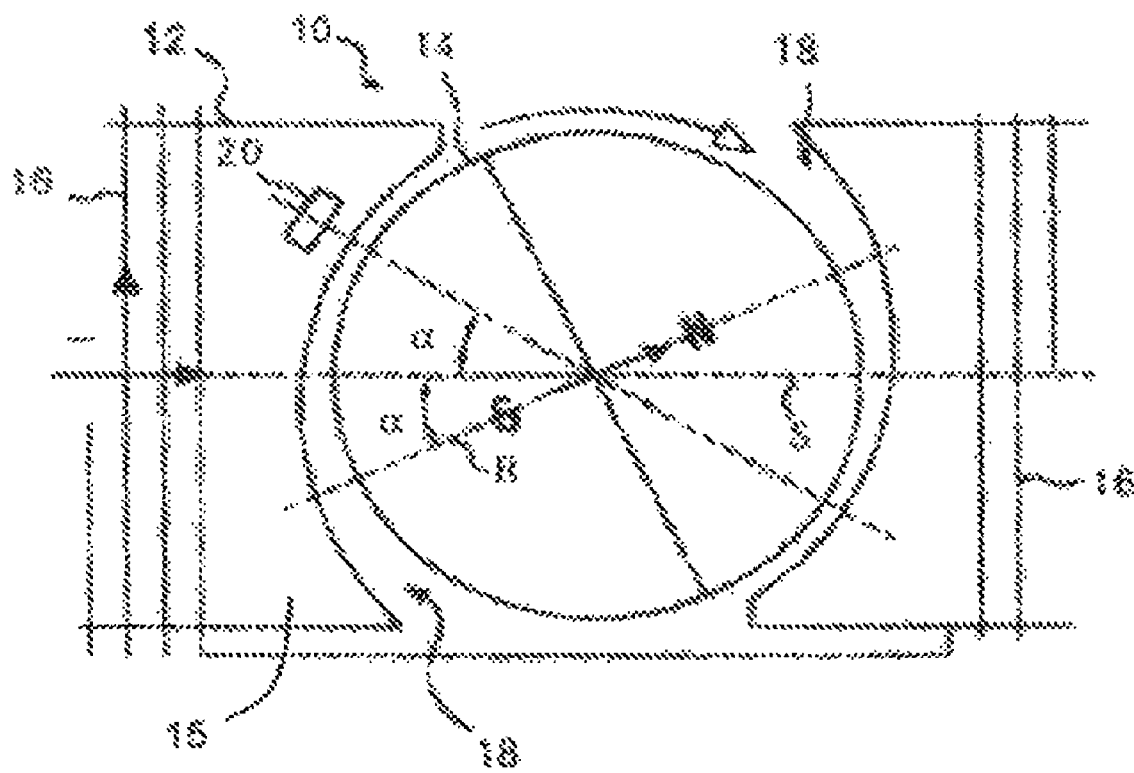
FIG. 3 illustrates a representation of a synchronous motor, according to an embodiment of the present teaching.

FIG. 3 schematically shows a synchronous motor according to an embodiment of the present invention. The synchronous motor 10 includes a stator 12 and a permanent magnet rotor 14 rotatably disposed between magnetic poles of the stator 12, and the stator 12 includes a stator core 15 and a stator winding 16 wound on the stator core 15. The rotor 14 includes at least one permanent magnet forming at least one pair of permanent magnetic poles with opposite polarities, and the rotor 14 operates at a constant rotational speed of 60 f/p during a steady state phase in a case that the stator winding 16 is connected to an AC power supply, where f is a frequency of the AC power supply and p is the number of pole pairs of the rotor.

Non-uniform gap 18 is formed between the magnetic poles of the stator 12 and the permanent magnetic poles of the rotor 14 so that a polar axis R of the rotor 14 has an angular offset a relative to a central axis S of the stator 12 in a case that the rotor is at rest. The rotor 14 may be configured to have a fixed starting direction (a clockwise direction in this embodiment as shown by the arrow in FIG. 3) every time the stator winding 16 is energized. The stator and the rotor each have two magnetic poles as shown in FIG. 3. It can be understood that, in other embodiments, the stator and the rotor may also have more magnetic poles, such as 4 or 6 magnetic poles.

A position sensor 20 for detecting the angular position of the rotor is disposed on the stator 12 or at a position near the rotor inside the stator, and the position sensor 20 has an angular offset relative to the central axis S of the stator. Preferably, this angular offset is also a, as in this embodiment. Preferably, the position sensor 20 is a Hall effect sensor.

Figure 4:
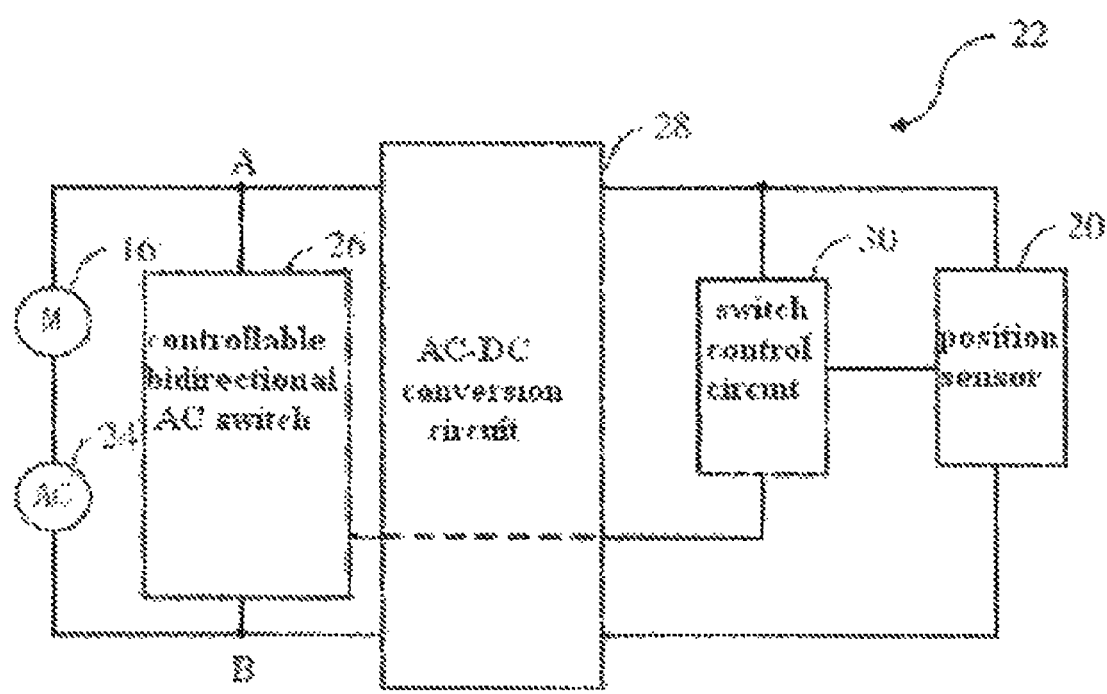
FIG. 4 illustrates a block diagram of a drive circuit for a synchronous motor, according to an embodiment of the present teaching.

FIG. 4 shows a block diagram of a drive circuit for a synchronous motor according to an embodiment of the present invention. In the drive circuit 22, the stator winding 16 and the AC power supply 24 are connected in series between two nodes A and B. Preferably, the AC power supply 24 may be a commercial AC power supply with a fixed frequency, such as 50 Hz or 60 Hz, and a supply voltage may be, for example, 110V, 220V or 230V. A controllable bidirectional AC switch 26 is connected between the two nodes A and B, in parallel with the stator winding 16 and the AC power supply 24. Preferably, the controllable bidirectional AC switch 26 is a TRIAC, of which two anodes are connected to the two nodes A and B respectively. It can be understood that, the controllable bidirectional AC switch 26 alternatively may be two silicon control rectifiers reversely connected in parallel, and control circuits may be correspondingly configured to control the two silicon control rectifiers in a preset way. An AC-DC conversion circuit 28 is also connected between the two nodes A and B. An AC voltage between the two nodes A and B is converted by the AC-DC conversion circuit 28 into a low voltage DC. The position sensor 20 may be powered by the low voltage DC output by the AC-DC conversion circuit 28, for detecting the magnetic pole position of the permanent magnet rotor 14 of the synchronous motor 10 and outputting a corresponding signal. A switch control circuit 30 is connected to the AC-DC conversion circuit 28, the position sensor 20 and the controllable bidirectional AC switch 26, and is configured to control the controllable bidirectional AC switch 26 to be switched between a switch-on state and a switch-off state in a predetermined way, based on the magnetic pole position of the permanent magnet rotor which is detected by the position sensor and polarity information of the AC power supply 24 which may be obtained from the AC-DC conversion circuit 28, such that the stator winding 16 urges the rotor 14 to rotate only in the above-mentioned fixed starting direction during a starting phase of the motor. According to this embodiment of the present invention, in a case that the controllable bidirectional AC switch 26 is switched on, the two nodes A and B are shorted, the AC-DC conversion circuit 28 does not consume electric energy since there is no current flowing through the AC-DC conversion circuit 28, hence, the utilization efficiency of electric energy can be improved significantly.

Figure 5:
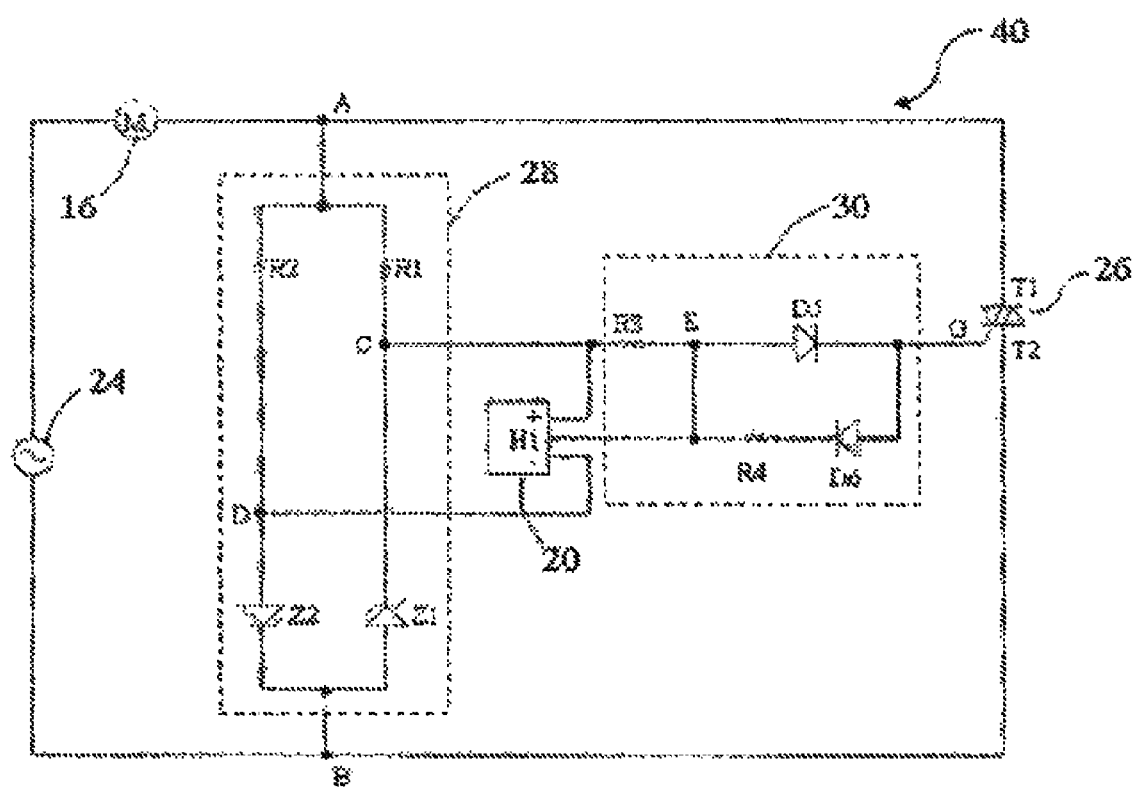
FIG. 5 illustrates a drive circuit for a synchronous motor, according to an embodiment of the present teaching.

FIG. 5 shows a circuit diagram of a drive circuit 40 for a synchronous motor according to a first embodiment of the present disclosure. The stator winding 16 of the synchronous motor is connected in series with the AC power supply 24 between the two nodes A and B. A first anode T1 of the TRIAC 26 is connected to the node A, and a second anode T2 of the TRIAC 26 is connected to the node B. The AC-DC conversion circuit 28 is connected in parallel with the TRIAC 26 between the two nodes A and B. An AC voltage between the two nodes A and B is converted by the AC-DC conversion circuit 28 into a low voltage DC (preferably, low voltage ranges from 3V to 18V). The AC-DC conversion circuit 28 includes a first zener diode Z1 and a second zener diode Z2 which are reversely connected in parallel between the two nodes A and B via a first resistor R1 and a second resistor R2 respectively. A high voltage output terminal C of the AC-DC conversion circuit 28 is formed at a connection point of the first resistor R1 and a cathode of the first zener diode Z1, and a low voltage output terminal D of the AC-DC conversion circuit 28 is formed at a connection point of the second resistor R2 and an anode of the second zener diode Z2. The voltage output terminal C is connected to a positive power supply terminal of the position sensor 20, and the voltage output terminal D is connected to a negative power supply terminal of the position sensor 20. Three terminals of the switch control circuit 30 are connected to the high voltage output terminal C of the AC-DC conversion circuit 28, an output terminal H1 of the position sensor 20 and a control electrode G of the TRIAC 26 respectively. The switch control circuit 30 includes a third resistor R3, a fifth diode D5, and a fourth resistor R4 and a sixth diode D6 connected in series between the output terminal H1 of the position sensor 20 and the control electrode G of the controllable bidirectional AC switch 26. An anode of the sixth diode D6 is connected to the control electrode G of the controllable bidirectional AC switch 26. One terminal of the third resistor R3 is connected to the high voltage output terminal C of the AC-DC conversion circuit 28, and the other terminal of the third resistor R3 is connected to an anode of the fifth diode D5. A cathode of the fifth diode D5 is connected to the control electrode G of the controllable bidirectional AC switch 26.

Figure 6:
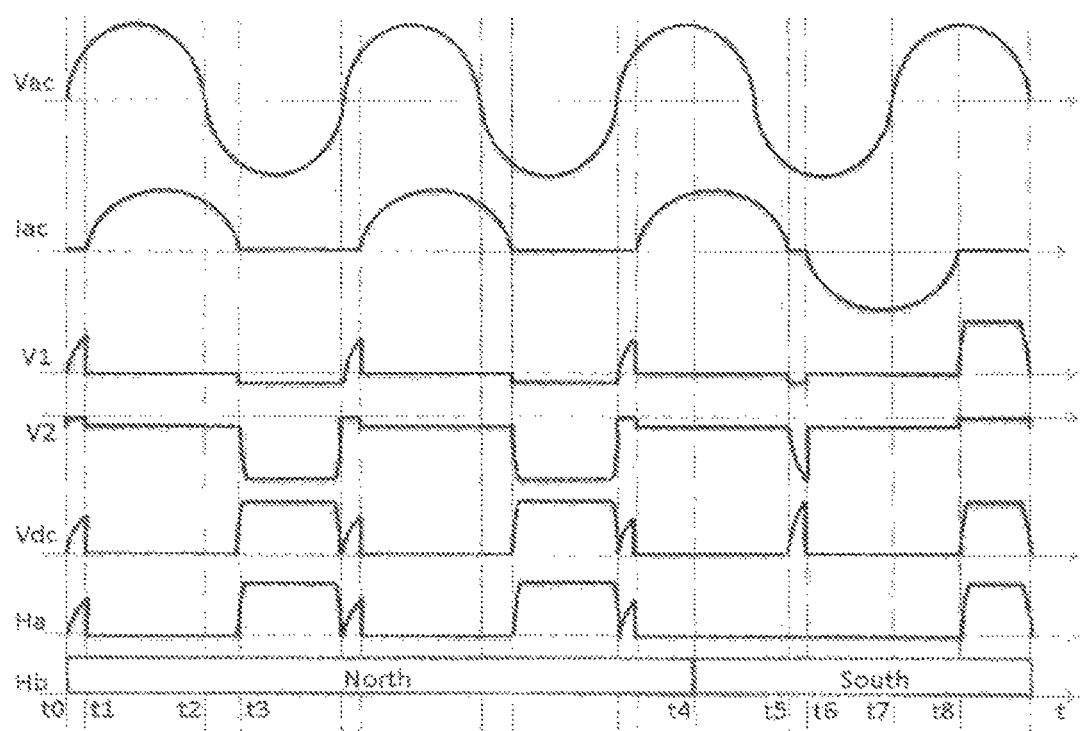
FIG. 6 illustrates waveforms at different locations of the drive circuit shown in FIG. 5.

In conjunction with FIG. 6, an operational principle of the drive circuit 40 is described. In FIG. 6, Vac indicates a waveform of voltage of the AC power supply 24, and Iac indicates a waveform of current flowing through the stator winding 16. Due to the inductive character of the stator winding 16, the waveform of current Iac lags behind the waveform of voltage Vac. V1 indicates a waveform of voltage between two terminals of the first zener diode Z1, V2 indicates a waveform of voltage between two terminals of the second zener diode Z2, Vdc indicates a waveform of voltage between two output terminals C and D of the AC-DC conversion circuit 28, Ha indicates a waveform of a signal output by the output terminal H1 of the position sensor 20, and Hb indicates a rotor magnetic field detected by the position sensor 20. In this embodiment, in a case that the position sensor 20 is powered normally, the output terminal HI outputs a logic high level in a case that the detected rotor magnetic field is North, or the output terminal H1 outputs a logic low level in a case that the detected rotor magnetic field is South.

In a case that the rotor magnetic field Hb detected by the position sensor 20 is North, in a first positive half cycle of the AC power supply, the supply voltage is gradually increased from a time instant t0 to a time instant t1, the output terminal H1 of the position sensor 20 outputs a high level, and a current flows through the resistor R1, the resistor R3, the diode D5 and the control electrode G and the second anode T2 of the TRIAC 26 sequentially. The TRIAC 26 is switched on in a case that a drive current flowing through the control electrode G and the second anode T2 is greater than a gate triggering current Ig. Once the TRIAC 26 is switched on, the two nodes A and B are shorted, a current flowing through the stator winding 16 in the motor is gradually increased until a large forward current flows through the stator winding 16 to drive the rotor 14 to rotate clockwise as shown in FIG. 3. Since the two nodes A and B are shorted, there is no current flowing through the AC-DC conversion circuit 28 from the time instant t1 to a time instant t2. Hence, the resistors R1 and R2 do not consume electric energy, and the output of the position sensor 20 is stopped due to no power is supplied. Since the current flowing through two anodes T1 and T2 of the TRIAC 26 is large enough (which is greater than a holding current Ihold), the TRIAC 26 is kept to be switched on in a case that there is no drive current flowing through the control electrode G and the second anode T2. In a negative half cycle of the AC power supply, after a time instant t3, a current flowing through T1 and T2 is less than the holding current Ihold, the TRIAC 26 is switched off, a current begins to flow through the AC-DC conversion circuit 28, and the output terminal HI of the position sensor 20 outputs a high level again. Since a potential at the point C is lower than a potential at the point E, there is no drive current flowing through the control electrode G and the second anode T2 of the TRIAC 26, and the TRIAC 26 is kept to be switched off. Since the resistance of the resistors R1 and R2 in the AC-DC conversion circuit 28 are far greater than the resistance of the stator winding 16 in the motor, a current currently flowing through the stator winding 16 is far less than the current flowing through the stator winding 16 from the time instant t1 to the time instant t2 and generates very small driving force for the rotor 14. Hence, the rotor 14 continues to rotate clockwise due to inertia. In a second positive half cycle of the AC power supply, similar to the first positive half cycle, a current flows through the resistor R1, the resistor R3, the diode D5, and the control electrode G and the second anode T2 of the TRIAC 26 sequentially. The TRIAC 26 is switched on again, and the current flowing through the stator winding 16 continues to drive the rotor 14 to rotate clockwise. Similarly, the resistors R1 and R2 do not consume electric energy since the two nodes A and B are shorted. In the next negative half cycle of the power supply, the current flowing through the two anodes T1 and T2 of the TRIAC 26 is less than the holding current Ihold, the TRIAC 26 is switched off again, and the rotor continues to rotate clockwise due to the effect of inertia.

At a time instant t4, the rotor magnetic field Hb detected by the position sensor 20 changes to be South from North, the AC power supply is still in the positive half cycle and the TRIAC 26 is switched on, the two nodes A and B are shorted, and there is no current flowing through the AC-DC conversion circuit 28. After the AC power supply enters the negative half cycle, the current flowing through the two anodes T1 and T2 of the TRIAC 26 is gradually decreased, and the TRIAC 26 is switched off at a time instant t5. Then the current flows through the second anode T2 and the control electrode G of the TRIAC 26, the diode D6, the resistor R4, the position sensor 20, the resistor R2 and the stator winding 16 sequentially. As the drive current is gradually increased, the TRIAC 26 is switched on again at a time instant t6, the two nodes A and B are shorted again, the resistors R1 and R2 do not consume electric energy, and the output of the position sensor 20 is stopped due to no power is supplied. There is a larger reverse current flowing through the stator winding 16, and the rotor 14 continues to be driven clockwise since the rotor magnetic field is South. From the time instant t5 to the time instant t6, the first zener diode Z1 and the second zener diode Z2 are switched on, hence, there is a voltage output between the two output terminals C and D of the AC-DC conversion circuit 28. At a time instant t7, the AC power supply enters the positive half cycle again, the TRIAC 26 is switched off when the current flowing through the TRIAC 26 crosses zero, and then a voltage of the control circuit is gradually increased. As the voltage is gradually increased, a current begins to flow through the AC-DC conversion circuit 28, the output terminal H1 of the position sensor 20 outputs a low level, there is no drive current flowing through the control electrode G and the second anode T2 of the TRIAC 26, hence, the TRIAC 26 is switched off. Since the current flowing through the stator winding 16 is very small, nearly no driving force is generated for the rotor 14. At a time instant t8, the power supply is in the positive half cycle, the position sensor outputs a low level, the TRIAC 26 is kept to be switched off after the current crosses zero, and the rotor continues to rotate clockwise due to inertia. According to an embodiment of the present invention, the rotor may be accelerated to be synchronized with the stator after rotating only one circle after the stator winding is energized.

In the embodiment of the present invention, by taking advantage of a feature of a TRIAC that the TRIAC is kept to be switched on although there is no drive current flowing though the TRIAC once the TRIAC is switched on, it is avoided that a resistor in the AC-DC conversion circuit still consumes electric energy after the TRIAC is switched on, hence, the utilization efficiency of electric energy can be improved significantly.

Figure 7:
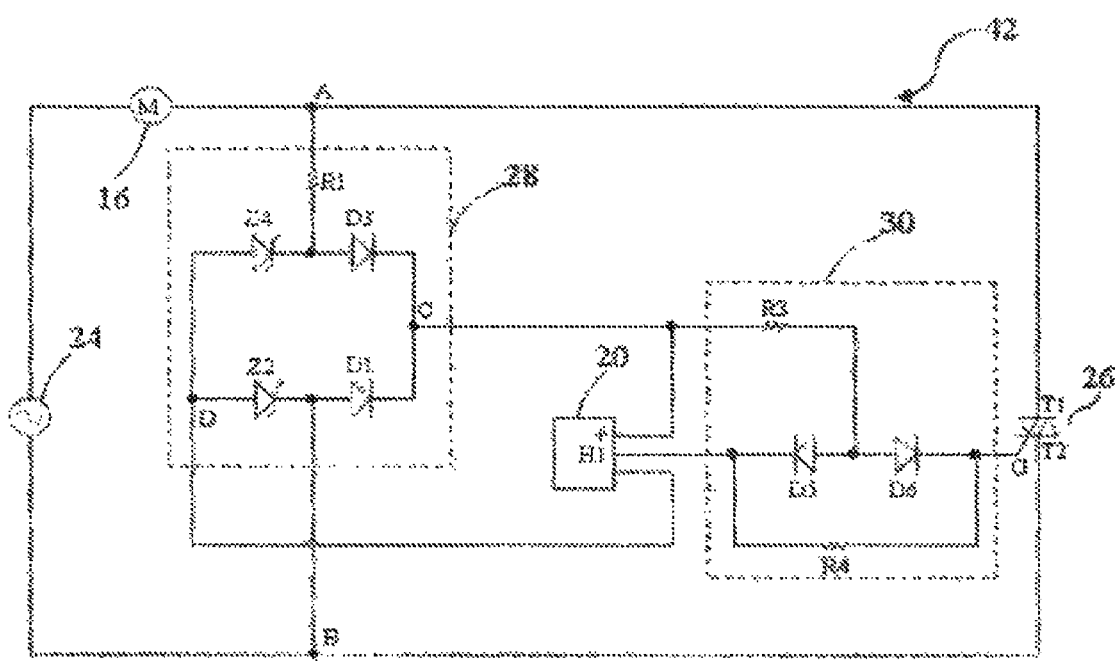
FIGS. 7 to 10 illustrate different embodiments of a drive circuit of a synchronous motor, according to an embodiment of the present teaching.

FIG. 7 shows a circuit diagram of a drive circuit 42 for a synchronous motor according to an embodiment of the present disclosure. The stator winding 16 of the synchronous motor is connected in series with the AC power supply 24 between the two nodes A and B. A first anode T1 of the TRIAC 26 is connected to the node A, and a second anode T2 of the TRIAC 26 is connected to the node B. The AC-DC conversion circuit 28 is connected in parallel with the TRIAC 26 between the two nodes A and B. An AC between the two nodes A and B is converted by the AC-DC conversion circuit 28 into a low voltage DC, preferably, a low voltage ranging from 3V to 18V. The AC-DC conversion circuit 28 includes a first resistor R1 and a full wave bridge rectifier connected in series between the two nodes A and B. The full wave bridge rectifier includes two rectifier branches connected in parallel, one of the two rectifier branches includes a first diode D1 and a third diode D3 reversely connected in series, and the other of the two rectifier branches includes a second zener diode Z2 and a fourth zener diode Z4 reversely connected in series, the high voltage output terminal C of the AC-DC conversion circuit 28 is formed at a connection point of a cathode of the first diode D1 and a cathode of the third diode D3, and the low voltage output terminal D of the AC-DC conversion circuit 28 is formed at a connection point of an anode of the second zener diode Z2 and an anode of the fourth zener diode Z4. The output terminal C is connected to a positive power supply terminal of the position sensor 20, and the output terminal D is connected to a negative power supply terminal of the position sensor 20. The switch control circuit 30 includes a third resistor R3, a fourth resistor R4, and a fifth diode D5 and a sixth diode D6 reversely connected in series between the output terminal H1 of the position sensor 20 and the control electrode G of the controllable bidirectional AC switch 26. A cathode of the fifth diode D5 is connected to the output terminal H1 of the position sensor, and a cathode of the sixth diode D6 is connected to the control electrode G of the controllable bidirectional AC switch. One terminal of the third resistor R3 is connected to the high voltage output terminal C of the AC-DC conversion circuit, and the other terminal of the third resistor R3 is connected to a connection point of an anode of the fifth diode D5 and an anode of the sixth diode D6. Two terminals of the fourth resistor R4 are connected to a cathode of the fifth diode D5 and a cathode of the sixth diode D6 respectively.

Figure 8:
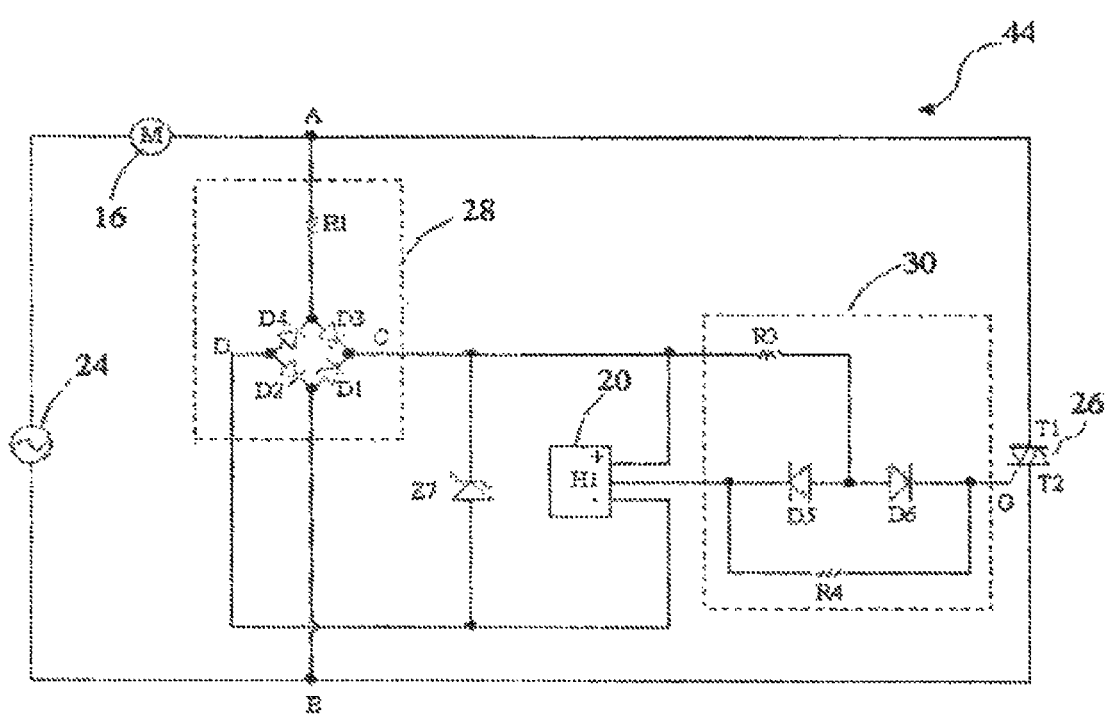

FIG. 8 shows a circuit diagram of a drive circuit 44 for a synchronous motor according to a further embodiment of the present invention. The drive circuit 44 is similar to the drive circuit 42 in the previous embodiment and, the drive circuit 44 differs from the drive circuit 42 in that, the zener diodes Z2 and Z4 in the drive circuit 42 are replaced by general diodes D2 and D4 in the rectifier of the drive circuit 44. In addition, a zener diode Z7 is connected between the two output terminals C and D of the AC-DC conversion circuit 28 in the drive circuit 44.

Figure 9:
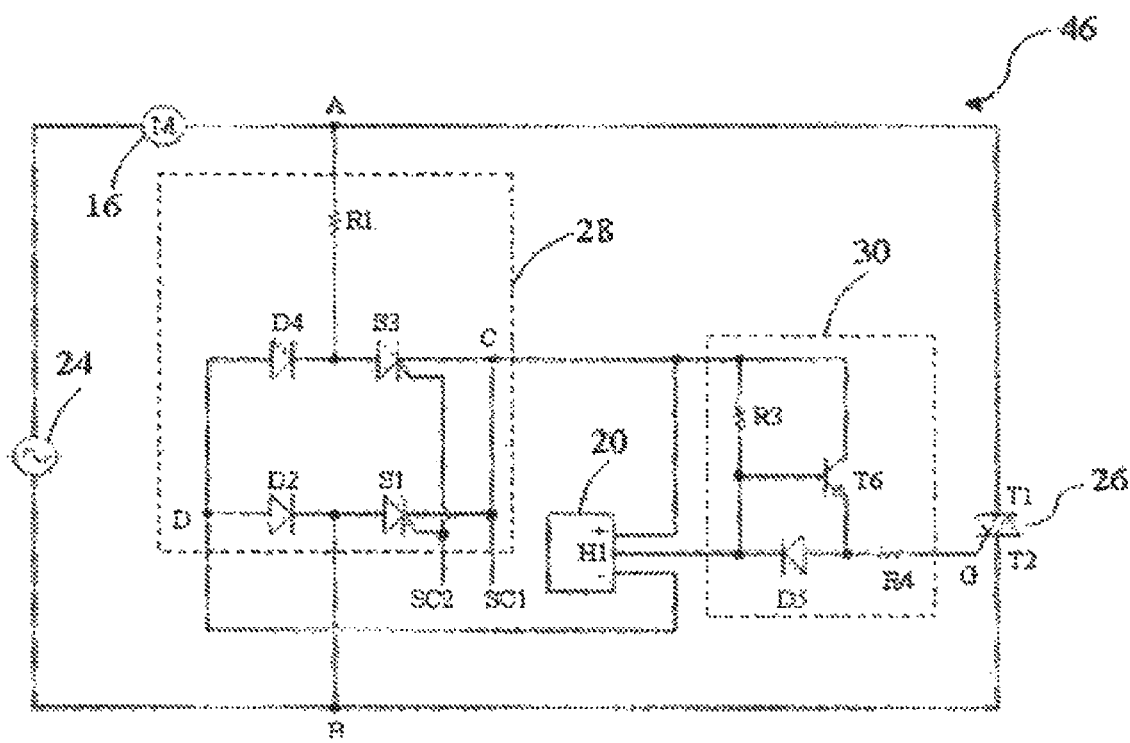

FIG. 9 shows a circuit diagram of a drive circuit 46 for a synchronous motor according to further embodiment of the present invention. The stator winding 16 of the synchronous motor is connected in series with the AC power supply 24 between the two nodes A and B. A first anode T1 of the TRIAC 26 is connected to the node A, and a second anode T2 of the TRIAC 26 is connected to the node B. The AC-DC conversion circuit 28 is connected in parallel with the TRIAC 26 between the two nodes A and B. An AC voltage between the two nodes A and B is converted by the AC-DC conversion circuit 28 into a low voltage DC, preferably, a low voltage ranging from 3V to 18V. The AC-DC conversion circuit 28 includes a first resistor R1 and a full wave bridge rectifier connected in series between the two nodes A and B. The full wave bridge rectifier includes two rectifier branches connected in parallel, one of the two rectifier branches includes two silicon control rectifiers S1 and S3 reversely connected in series, and the other of the two rectifier branches includes a second diode D2 and a fourth diode D4 reversely connected in series. The high voltage output terminal C of the AC-DC conversion circuit 28 is formed at a connection point of a cathode of the silicon control rectifier S1 and a cathode of the silicon control rectifier S3, and the low voltage output terminal D of the AC-DC conversion circuit 28 is formed at a connection point of an anode of the second diode D2 and an anode of the fourth diode D4. The output terminal C is connected to a positive power supply terminal of the position sensor 20, and the output terminal D is connected to a negative power supply terminal of the position sensor 20. The switch control circuit 30 includes a third resistor R3, an NPN transistor T6, and a fourth resistor R4 and a fifth diode D5 connected in series between the output terminal H1 of the position sensor 20 and the control electrode G of the controllable bidirectional AC switch 26. A cathode of the fifth diode D5 is connected to the output terminal H1 of the position sensor. One terminal of the third resistor R3 is connected to the high voltage output terminal C of the AC-DC conversion circuit, and the other terminal of the third resistor R3 is connected to the output terminal H1 of the position sensor. A base of the NPN transistor T6 is connected to the output terminal H1 of the position sensor, an emitter of the NPN transistor T6 is connected to an anode of the fifth diode D5, and a collector of the NPN transistor T6 is connected to the high voltage output terminal C of the AC-DC conversion circuit.

In this embodiment, a reference voltage may be input to the cathodes of the two silicon control rectifiers S1 and S3 via a terminal SC1, and a control signal may be input to control terminals of S1 and S3 via a terminal SC2. The rectifiers S1 and S3 are switched on in a case that the control signal input from the terminal SC2 is a high level, or are switched off in a case that the control signal input from the terminal SC2 is a low level. Based on the configuration, the rectifiers S1 and S3 may be switched between a switch-on state and a switch-off state in a preset way by inputting the high level from the terminal SC2 in a case that the drive circuit operates normally. The rectifiers S1 and S3 are switched off by changing the control signal input from the terminal SC2 from the high level to the low level in a case that the drive circuit fails. In this case, the TRIAC 26, the conversion circuit 28 and the position sensor 20 are switched off, to ensure the whole circuit to be in a zero-power state.

Figure 10:
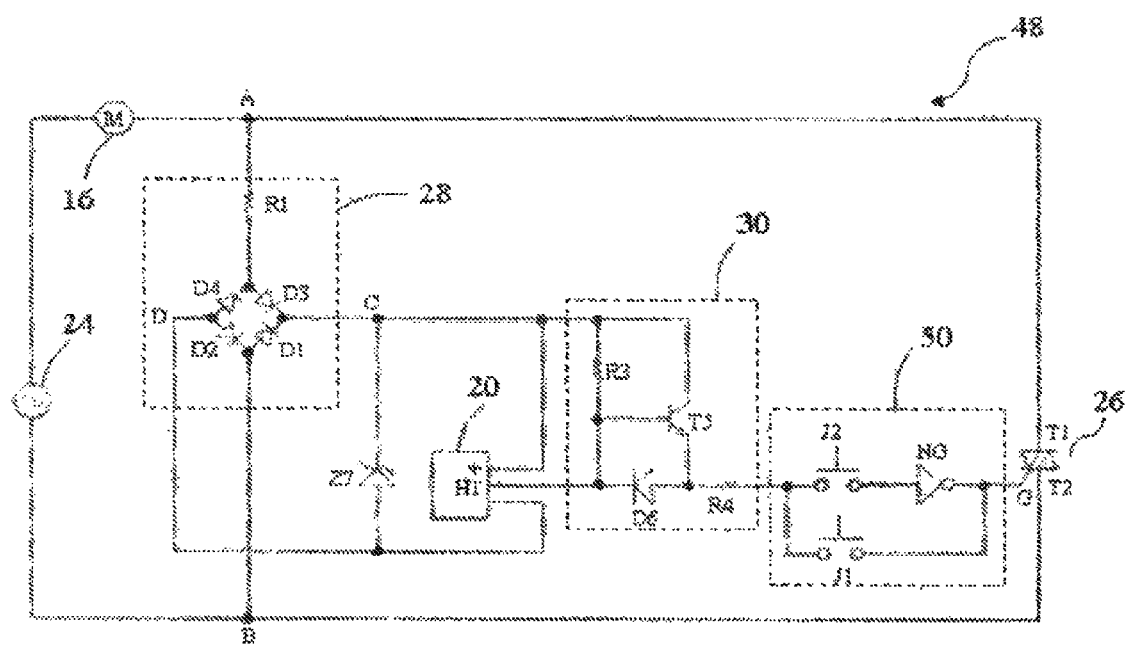

FIG. 10 shows a circuit diagram of a drive circuit 48 for a synchronous motor according to another embodiment of the present invention. The drive circuit 48 is similar to the drive circuit 46 in the previous embodiment and, the drive circuit 48 differs from the drive circuit 46 in that, the silicon control diodes S1 and S3 in the drive circuit 46 are replaced by general diodes D1 and D3 in the rectifier of the drive circuit 48, and a zener diode Z7 is connected between the two terminals C and D of the AC-DC conversion circuit 28. In addition, in the drive circuit 48 according to the embodiment, a preset steering circuit 50 is disposed between the switch control circuit 30 and the TRIAC 26. The preset steering circuit 50 includes a first jumper switch J1, a second jumper J2 switch and an inverter NG connected in series with the second jumper switch J2. Similar to the drive circuit 46, in this embodiment, the switch control circuit 30 includes the resistor R3, the resistor R4, the NPN transistor T5 and the diode D6. One terminal of the resistor R4 is connected to a connection point of an emitter of the transistor T5 and an anode of the diode D6, and the other terminal of the resistor R4 is connected to one terminal of the first jumper switch J1, and the other terminal of the first jumper switch J1 is connected to the control electrode G of the TRIAC 26, and the second jumper switch J2 and the inverter NG connected in series are connected across two terminals of the first jumper switch J1. In this embodiment, when the first jumper switch J1 is switched on and the second jumper switch J2 is switched off, similar to the above embodiments, the rotor 14 still starts clockwise; when the second jumper switch J2 is switched on and the first jumper switch J1 is switched off, the rotor 14 starts counterclockwise. In this case, a starting direction of the rotor in the motor may be selected by selecting one of the two jumper switches to be switched on and the other to be switched off. Therefore, in a case that a driving motor is needed to be supplied for different applications having opposite rotational directions, it is just needed to select one of the two jumper switches J1 and J2 to be switched on and the other to be switched off, and no other changes need to be made to the drive circuit, hence, the drive circuit according to this embodiment has good versatility.

As discussed above, the position sensor 20 is configured for detecting the magnetic pole position of the permanent magnet rotor 14 of the synchronous motor 10 and outputting a corresponding signal. The output signal from the position sensor 20 represents some characteristics of the magnetic pole position such as the polarity of the magnetic field associated with the magnetic pole position of the permanent magnet rotor 14 of the synchronous motor 10. The detected magnetic pole position is then used, by the switch control circuit 30, control the controllable bidirectional AC switch 26 to be switched between a switch-on state and a switch-off state in a predetermined way, based on, together with the magnetic pole position of the permanent magnet rotor, the polarity information of the AC power supply 24 which may be obtained from the AC-DC conversion circuit 28.

More details are disclosed about a magnetic sensor that comprises aspects of both the position sensor 20 and the switch control circuit 30. In describing the details of the magnetic sensor related to both the position sensor 20 and the switch control circuit 30, the present teaching of this continuation-in-part application more focuses on various details related to the realization of the position sensor 20 within the magnetic sensor as disclosed herein.

The magnetic sensor in the present teaching employs at least one folded cascode amplifier. The folded cascode amplifier can efficiently amplify a very small input signals to have a great gain. In addition, the folded cascode amplifier is configured with excellent frequency characteristics and is capable of processing signals expanded in a very wide frequency range. Further, the magnetic sensor in the present teaching may be directly connected to the city AC power supply with no need of additional A/D converting equipment. Therefore, the present teaching facilitates the implementation of the magnetic sensor into various fields. Further, the magnetic field detecting circuit can effectively amply the detected magnetic field signal, regulate the voltage and filter interference signals. Therefore, the magnetic sensor can generate more accurate signal with respect to the polarity of the external magnetic field to control the operation of the electric rotor.

Additional novel features will be set forth in part in the description which follows, and in part will become apparent to those skilled in the art upon examination of the following and the accompanying drawings or may be learned by production or operation of the examples. The novel features of the present teachings may be realized and attained by practice or use of various aspects of the methodologies, instrumentalities and combinations set forth in the detailed examples discussed below. The magnetic sensor, the signal processing method implemented in the magnetic sensor, and the motor using the magnetic sensor and the signal processing method disclosed herein below can be achieved using any circuit technology known to one of ordinary skill in the art including but not limited to the integrated circuit and other circuit implementations.

Figure 11:
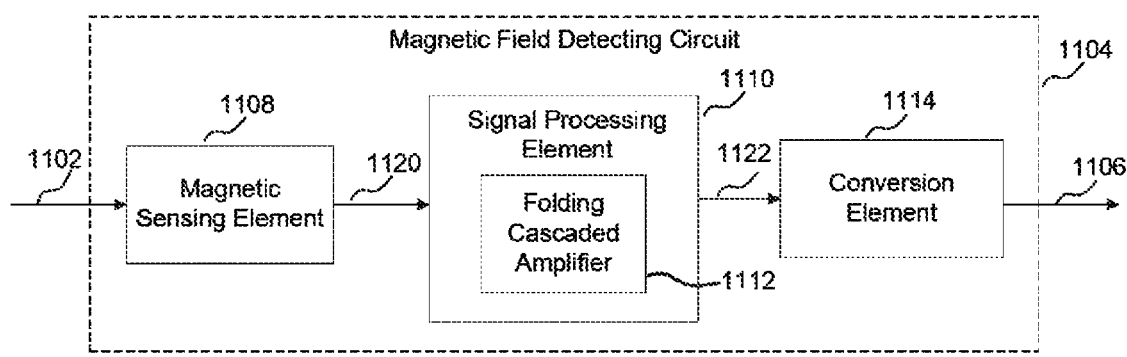
FIG. 11 illustrates an exemplary schematic diagram of a magnetic sensor, according to an embodiment of the present teaching.

FIG. 11 illustrates an exemplary schematic diagram of a magnetic sensor, according to an embodiment of the present teaching. The magnetic sensor according to this embodiment comprises an input port 1102, a magnetic field detecting circuit 1104 and an output port 1106. Input port 1102 is configured to connect to an external power supply and provide power to magnetic field detecting circuit 1104. In some embodiments, the external power supply is a direct current (DC) power supply. In another embodiment, the external power supply is an alternative current (AC) power supply. Magnetic field detecting circuit 1104 is configured to detect an external magnetic field and generate a magnetic field detecting signal. The magnetic field detecting signal 1106 is then applied to control the operating status of the magnetic sensor and the motor or any electric equipment that uses the magnetic sensor.

Magnetic field detecting circuit 1104 may comprise a magnetic sensing element 1108, a signal processing element 1110, and a conversion element 1114. Magnetic sensing element 1108 is configured to sense the external magnetic field and output a first detecting signal 1120. First detecting signal 1120 outputted from magnetic sensing element 1108 includes at least a magnetic field signal and a deviation signal. The magnetic field signal indicates an actual magnetic voltage signal associated with the external magnetic field that is sensed by magnetic sensing element 1108. The deviation signal is a bias signal inherited in magnetic sensing element 1108.

As the actual magnetic voltage signal may be interfered by at least the inherited bias signal, signal processing element 1110 is configured to amplify the received first detecting signal 1120, remove the interference signals from first detecting signal 1120, and generate a second detecting signal 1122. In some embodiments, signal processing element 1110 may comprise at least one folded cascode amplifier 1112.

The conversion element 1114 is configured to convert second detecting signal 1122 into magnetic field detecting signal and output magnetic field detecting signal via output port 1106. In some embodiments, magnetic field detecting signal is a switching detecting signal.

Figure 12:
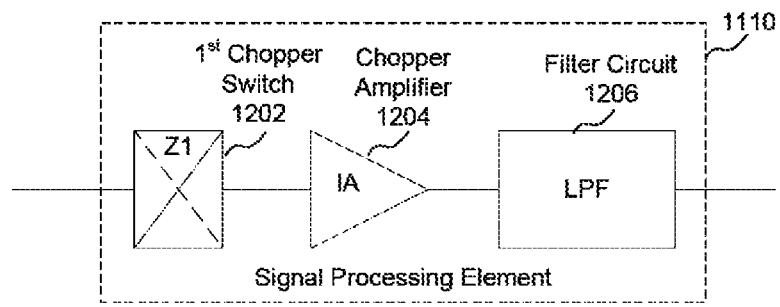
FIG. 12 illustrates an exemplary schematic diagram of the signal processing element 1110, according to an embodiment of the present teaching.

FIG. 12 illustrates an exemplary schematic diagram of the signal processing element 1110, according to an embodiment of the present teaching. Signal processing element 1110 according to FIG. 11 comprises a first chopper switch (Z1) 1202 and a first chopper amplifier (IA) 1204. First chopper switch 1202 is configured to separate the deviation signal and the magnetic field signal which will be carried on a baseband frequency and a chopper frequency, respectively. First chopper amplifier 1204 is configured to amplify the deviation signal and the magnetic field signal and switch the amplified deviation signal and the magnetic field signal to the chopper frequency and the baseband frequency, respectively, for transmission. In some embodiments, the chopper frequency is greater than 100K Hz, and the baseband frequency is less than 200 Hz.

In some embodiments, when the external power supply is an AC power supply, the baseband frequency is proportional to the frequency of the AC power supply. In some embodiments, the baseband frequency is twice the frequency of the AC power supply.

In some embodiments, signal processing element 1110 may further comprise a low-pass filter (LPF) 1206 configured to remove the deviation signal transmitted via the chopper frequency.

In this embodiments, each of the inputs and outputs of first chopper switch (Z1) 1202, first chopper amplifier (IA) 1204 and low-pass filter (LPF) 1206 are illustrated in a single line. It should be appreciated that FIG. 12 is for illustrative purpose. The present teaching is not intended to be limiting. Each of the inputs and outputs of first chopper switch (Z1) 1202, first chopper amplifier (IA) 1204 and low-pass filter (LPF) 1206 may be one or more input/output signals. In some embodiments, each of the inputs and outputs of first chopper switch (Z1) 1202, first chopper amplifier (IA) 1204 and low-pass filter (LPF) 1206 include one or more pairs of differential signals.

Figure 13A:
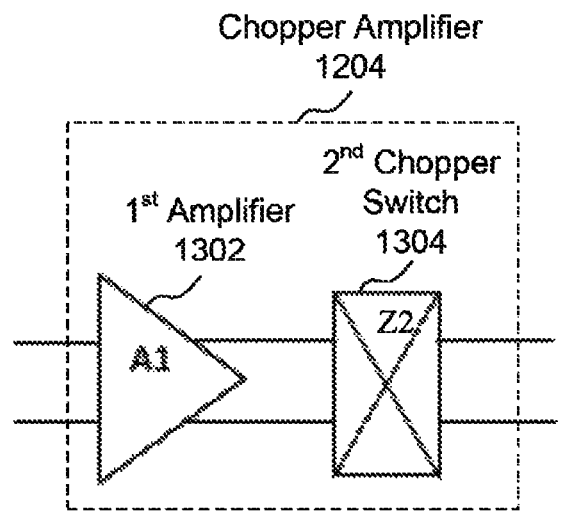
FIG. 13A illustrates an exemplary schematic diagram of a chopper amplifier 1204, according to an embodiment of the present teaching.

FIG. 13A illustrates an exemplary schematic diagram of a chopper amplifier 1204, according to an embodiment of the present teaching. First chopper amplifier (IA) 1204 in FIG. 12 comprises a first amplifier (A1) 1302 and a second chopper switch (Z2) 1304. First amplifier (A1) 1302 is configured to perform a first stage amplification of the deviation signal and the magnetic field signal from first chopper switch (Z1) 1202. In some embodiments, first amplifier (A1) 1302 is implemented using the at least one folded cascode amplifier such as 1112. Second chopper switch (Z2) 1304 is configured to switch the amplified deviation signal and the magnetic field signal to the chopper frequency and the baseband frequency for transmission, respectively.

Figure 13B:
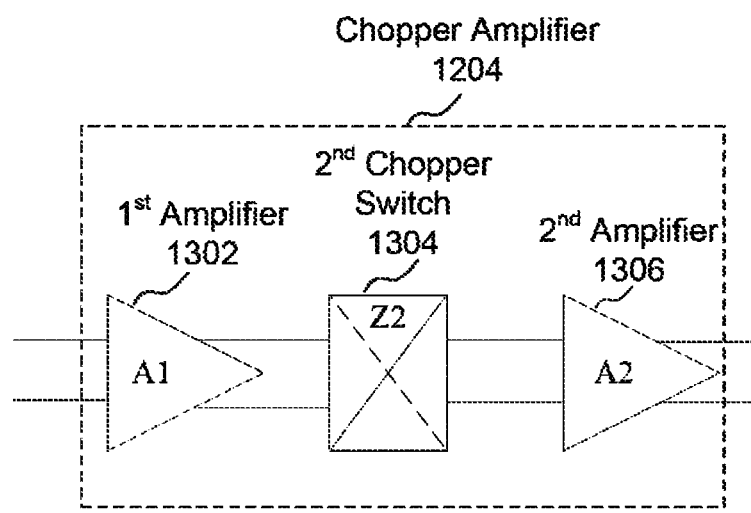
FIG. 13B illustrates an exemplary schematic diagram of a chopper amplifier 1204, according to another embodiment of the present teaching.

FIG. 13B illustrates an exemplary schematic diagram of a chopper amplifier 1204, according to another embodiment of the present teaching. According to the illustrated embodiment, first chopper amplifier (IA) 1204 in FIG. 12 may comprise a second amplifier (A2) 1306 in addition to first amplifier (A1) 1302 and second chopper switch (Z2) 1304. Second amplifier (A2) 1306 is configured to further perform a second stage amplification of the deviation signal and the magnetic field signal from second chopper switch (Z2) 1304. In some embodiments, second chopper switch (Z2) 1304 is implemented based on a single-stage amplifier.

It should be appreciated that the connections of first amplifier (A1) 1302, second chopper switch (Z2) 1304 and second amplifier (A2) 1306 in FIG. 13B are for illustrative purpose. The present teaching is not intended to be limiting. In some embodiments, second amplifier (A2) 1306 may be disposed between first amplifier (A1) 1302 and second chopper switch (Z2) 1304.

Figure 14:
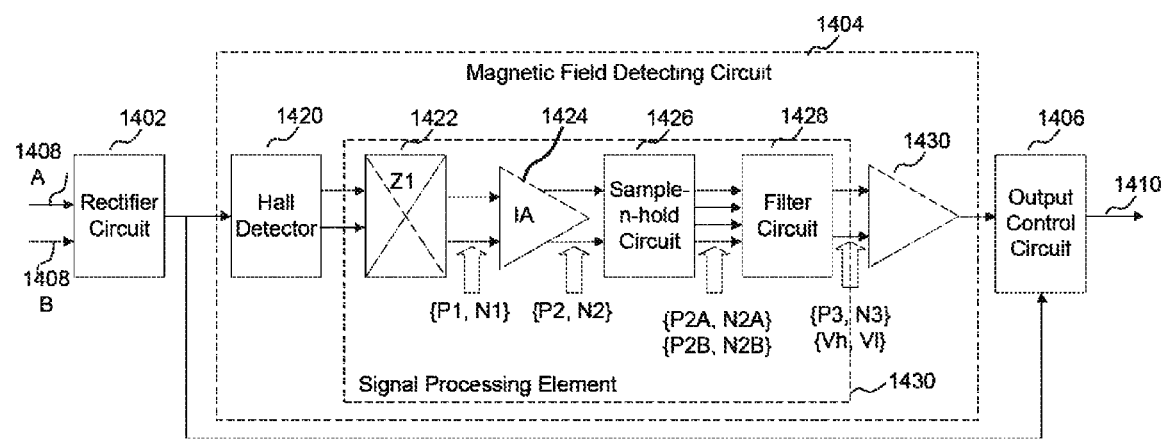
FIG. 14 illustrates an exemplary schematic diagram of a magnetic sensor, according to an embodiment of the present teaching.

FIG. 14 illustrates an exemplary schematic diagram of a magnetic sensor, according to another embodiment of the present teaching. The magnetic sensor according to the illustrate embodiment comprises an input port 1408, a rectifier circuit 1402, a magnetic field detecting circuit 1404, output control circuit 1406, and an output port 1410. Input port 1408 in this embodiment comprises a pair of input ports 1408A and 1408B that connect to the external power supply. In some embodiments, input port 1408 may connect to the external power supply serial. In yet other embodiments, input port 1408 may connect to the external power supply in parallel.

Rectifier circuit 1402 may be implemented based on a full wave rectifier bridge and a voltage regulator (not shown). A full wave rectifier bridge may be configured to convert an AC signal from the AC power supply into a DC signal. A voltage regulator may be configured to regulate the DC signal within a pre-set range. Rectifier circuit 1402 supplies the regulated DC signal to magnetic field detecting circuit 1404 and output control circuit 1406.

In this illustrated embodiment, magnetic field detecting circuit 1404 comprises a Hall detector 1420, a first chopper switch 1422, a first chopper amplifier 1424, a sample-and-hold circuit 1426, a filter circuit 1428, and a comparator circuit 1430. Hall detector 1420 connects to rectifier circuit 1402 to detect magnetic field signal and output the detected magnetic field signal to first chopper switch 1422. First chopper switch 1422 is configured to perform the same functions as first chopper switch 1202 shown in FIG. 12. First chopper switch 1422 outputs a first pair of differential signal {P1, N1} to first chopper amplifier 1424.

First chopper amplifier 1424 may be implemented based on what is illustrated in FIG. 13B. Thus, first chopper amplifier 1424 comprises a first amplifier (A1) 1302, a second chopper switch (Z2) 1304, and a second amplifier (A2) 1306. First amplifier (A1) 1302 performs the first stage amplification of the received first pair of differential signal {P1, N1}. Second chopper switch (Z2) 1304 is configured to directly output the amplified differential signal {P1, N1} in a first half of a clock cycle, and switch the amplified differential signal {P1, N1} to output in a second half of the clock cycle. Second chopper switch (Z2) 1304 outputs a second pair of differential signal {P2, N2}. The second pair of differential signal {P2, N2} may be further amplified by second amplifier (A2) 1306 before outputted to sample-and-hold circuit 1426.

Sample-and-hold circuit 1426 is configured to sample the amplified second pair of differential signal {P2, N2} outputted from first chopper amplifier 1424 in FIG. 14 during the first half and the second half of the clock cycle, respectively. Outputs of sample-and-hold circuit 1426 comprise two pairs of differential signals {P2A, N2A} and {P2B, N2B}, where the pair of {P2A, N2A} is outputted during the first half of the clock cycle and the pair of {P2B, N2B} is outputted during the second half of the clock cycle.

Filter circuit 1428 is configured to remove the deviation signal from the two pairs of differential signals {P2A, N2A} and {P2B, N2B}, and amplify of the differential signals {P2A, N2A} and {P2B, N2B}, and output a third differential signals {P3, N3} to comparator circuit 1430.

Comparator circuit 1430 is configured to compare the third pair of differential signals {P3, N3} with a pair of reference voltage signals, and determine the polarity of the external magnetic field based on the comparison results. Comparator circuit 1430 generates a magnetic field detecting signal indicating the determined polarity of the external magnetic field and outputs the same to output control circuit 1406. In some embodiments, the magnetic field detecting signal is a switching magnetic field detecting signal.

Output control circuit 1406 is configured to control the magnetic sensor to operate in a state in response to the determined polarity of the external magnetic field. The magnetic sensor may operate in a plurality of states. For example, a first state may correspond to a scenario in which a load current flows from inside to outside of the magnetic sensor via the output port 1410, and a second state may correspond to a scenario in which a load current flows from outside to inside the magnetic sensor via output port 1410. In some embodiments, the magnetic sensor may operate in a third status in which, no current flows through output port 1410.

The actual magnetic voltage signal is normally very small. For example, it is commonly to be less than 1 millivolt. However, the deviation signal generated by Hall detector 1420 is often higher, say, nearly 10 millivolt. The present teaching aims to remove the deviation signal and amplifies the actual magnetic voltage signal so that the actual magnetic voltage signal at an operable level can be provided to a motor or any electric equipment that uses the magnetic sensor. In some embodiments, the voltage supply to magnetic field detecting circuit 1404 is at the level of about 2.5V. When the detected signal outputted by Hall detector 1420 passes through first chopper switch 1422, first chopper amplifier 1424, sample-and-hold circuit 1426, and filter circuit 1428, the detected signal may be amplified 1000 to 2000 times of the original power gain, preferably somewhere in-between such as 1600 times the original power gain. As a result, the detected actual magnetic voltage signal is amplified to be approximately half of the voltage level supplied to magnetic field detecting circuit 1404. In some embodiments, the first chopper amplifier 1424 is configured to achieve a gain greater than that of filter circuit 1428. For example, the gain achieved by first chopper amplifier 1424 may be 50 while the gain achieved by filter circuit 1428 is 32.

Figure 15:
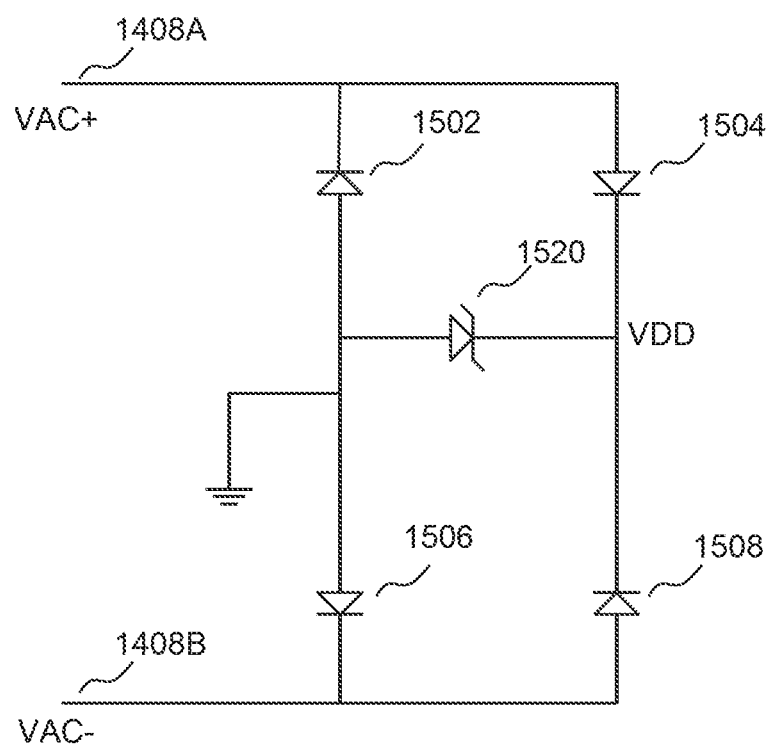
FIG. 15 illustrates an exemplary schematic diagram of a rectifier circuit 1402, according to an embodiment of the present teaching.

FIG. 15 illustrates an exemplary schematic diagram of a rectifier circuit 1402, according to an embodiment of the present teaching. According to the embodiment illustrated in FIG. 15, a full wave rectifier bridge is employed to implement the rectifier circuit 1402, which comprises a first diode 1502, a second diode 1504, a third diode 1506, and a fourth diode 1508; and a voltage regulator comprises a regulator diode 1520. First diode 1502 and second diode 1504 are connected in serial. Third diode 1506 and fourth diode 1508 are also connected in serial. The cathode of first diode 1502 and the anode of second diode 1504 are configured to connect to input port 1408A, which supplies voltage VAC+. The cathode of third diode 1506 and the anode of fourth diode 1508 are configured to connect to input port 1408B, which supplies voltage VAC−. The anode of regulator diode 1502 is configured to connect to the anode of first diode 1502 and the third diode 1506, which is further connected to ground. The cathode of regulator diode 1520 is connects to the cathode of second diode 1504 and fourth diode 1508 connecting together to voltage VDD.

Figure 16:
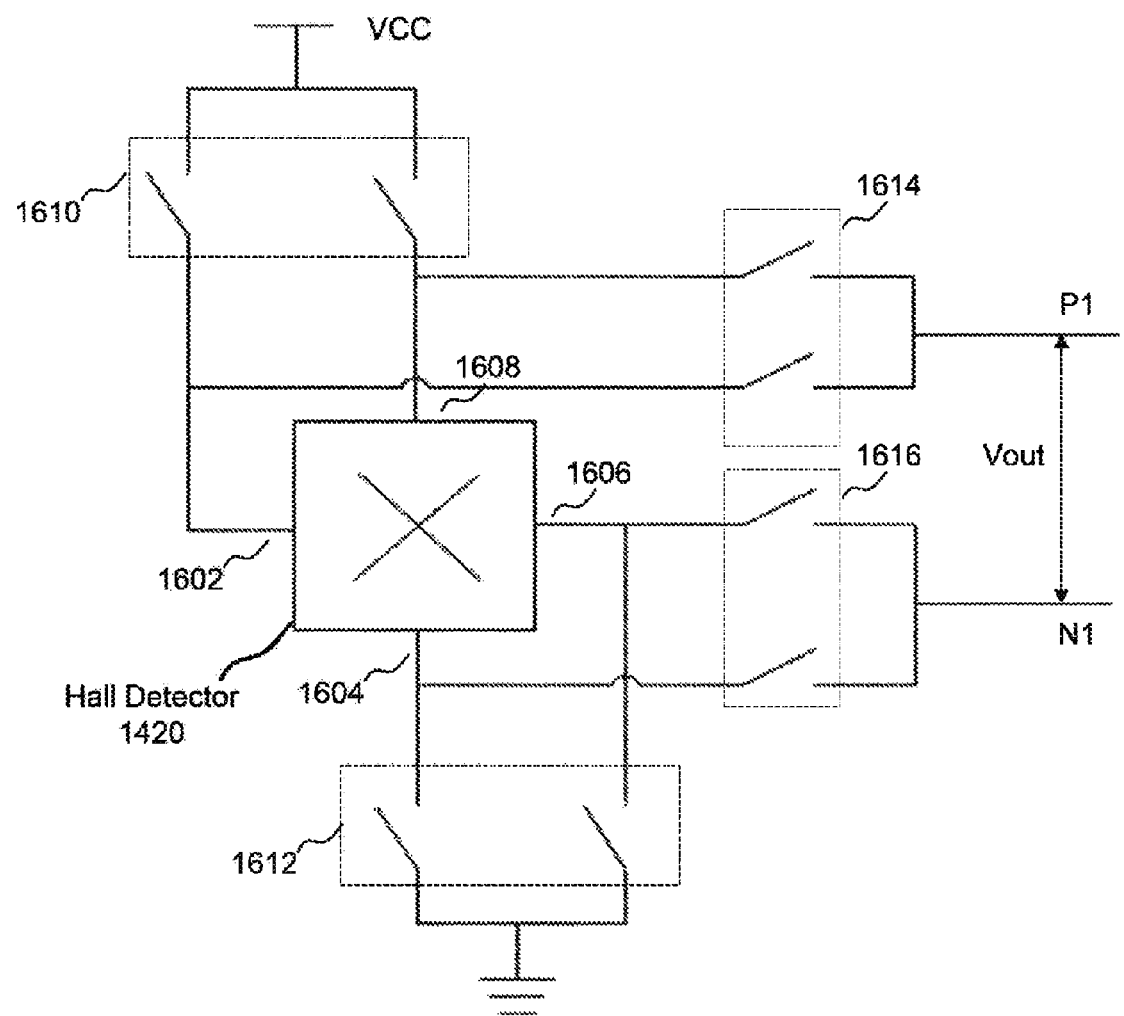
FIG. 16 illustrates an exemplary circuit diagram of a Hall detector 1420 and the first chopper switch, according to an embodiment of the present teaching.

FIG. 16 illustrates an exemplary circuit diagram of a Hall detector 1420 and the first chopper switch, according to an embodiment of the present teaching. According to the illustrated embodiment, Hall detector 1420 and first chopper switch 1422 are integrated as a single circuit in FIG. 16. Hall detector 1420 comprises a Hall detecting circuit board with four connecting ports 1602, 1604, 1606, and 1608. Connecting ports 1602 and 1606 are disposed opposing each other and connecting ports 1604 and 1608 are disposed opposing each other. First chopper switch 1422 comprises four switches 1610, 1612, 1614, and 1616. Switch 1610 controls connecting ports 1602 and 1608 to alternately connect to power supply VCC, and switch 1612 controls connecting ports 1604 and 1606 to alternately connect to ground. Switch 1614 controls connecting ports 1602 and 1608 to alternately output differential signal P1, and switch 1616 controls connecting ports 1604 and 1606 to alternately output differential signal N1. In some embodiments, Hall detector 1420 and first chopper switch 1422 are configured such that when one of connecting ports 1602 and 1608 connects to power supply VCC, the other one of connecting ports 1602 and 1608 outputs differential signal P1. Meanwhile, when one of connecting ports 1604 and 1606 connects to the ground, the other one of connecting ports 1604 and 1606 outputs differential signal N1. For example, when connecting port 1602 connects to power supply VCC and connecting port 1606 connects to the ground, connecting ports 1608 and 1604 output the pair of differential signal {P1, N1}. In the alternative, when connecting port 1608 connects to power supply VCC and connecting port 1604 connects to the ground, connecting ports 1602 and 1606 output the first pair of differential signal {P1, N1}.

In some embodiments, power supply VCC may be a constant voltage source achieved via performing voltage dropping and regulating on the output of rectifier circuit 1402. In other embodiments, power supply VCC may be a constant current source.

In some embodiments, each of switches 1610, 1612, 1614, and 1616 comprises a pair of switches configured to be high-voltage conduction or low-voltage conduction. Each of such pairs of switches may be controlled by a pair of complementary clock signals. By supplying two pairs of complementary clock signals in the same frequency to switches 1610, 1612, 1614, and 1616, respectively, Hall detector 1420 and first chopper switch 1422 can generate the first pair differential signals {P1, N1}.

Figure 17:
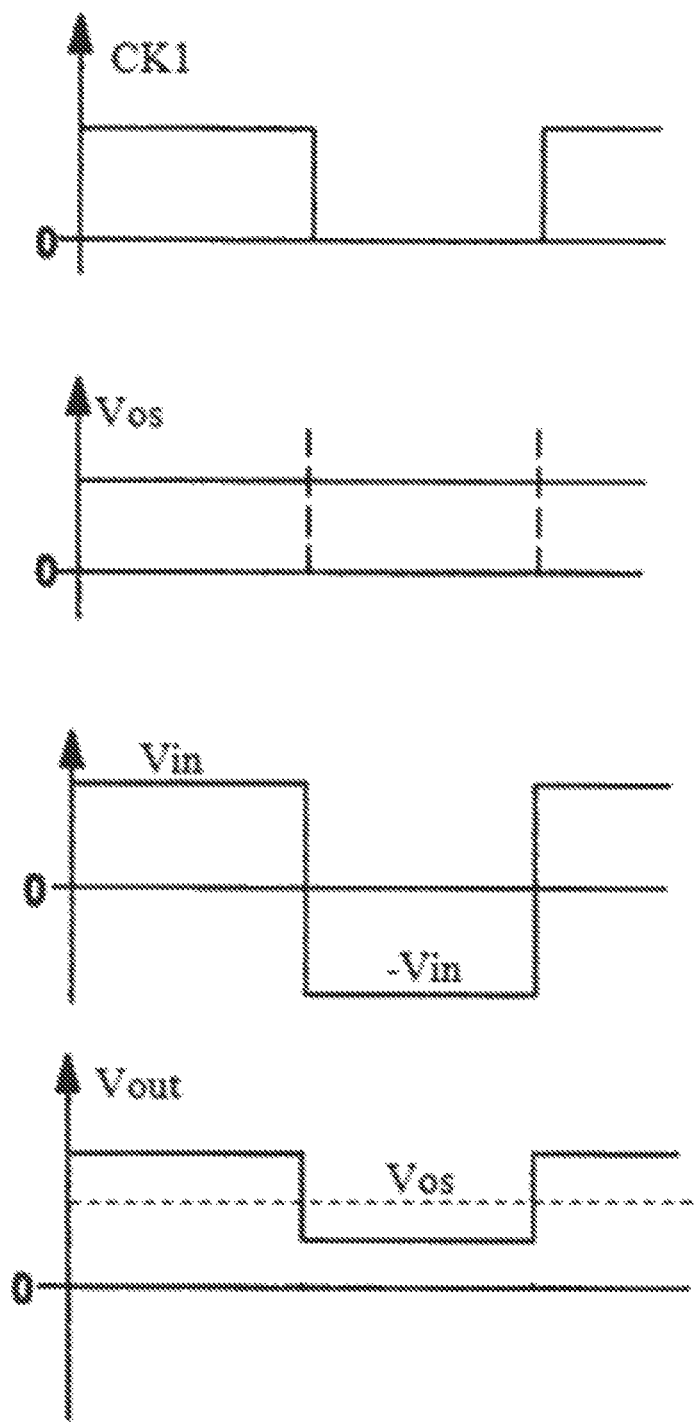
FIG. 17 illustrates exemplary signal outputs, according to the circuit diagram of FIG. 16.

FIG. 17 illustrates exemplary signal outputs, according to the circuit diagram of FIG. 16. Signal CK1 denotes a clock signal. Signal Vos denotes the deviation signal that is inherited in Hall detector 1420. In general, signal Vos depends on the physical characteristics of Hall detector 1420. Vin and −Vin denote the actual magnetic field voltage signal outputted by first chopper switch 1422 during the first half and the second half of clock signal CK1, respectively. The actual magnetic field voltage signal is an ideal magnetic field voltage signal associated with the external magnetic field without the interference caused by the deviation signal. During the first half and the second half of clock signal CK1, the actual magnetic field voltage signals outputted by first chopper switch 1422 have the same amplitude and opposite polarity. Vout denotes the output of first chopper switch 1422, which is the actual magnetic field voltage signal Vin or −Vin superimposed by or in combination with deviation signal Vos. First chopper switch 1422 separates the actual magnetic field voltage signal Vin or Vin and deviation signal Vos, and switches them onto a chopper frequency and a baseband frequency, respectively. In some embodiments, the chopper frequency is the frequency of clock signal CK1 and the baseband frequency is the polarity changing frequency of the external magnetic field.

Figure 18:
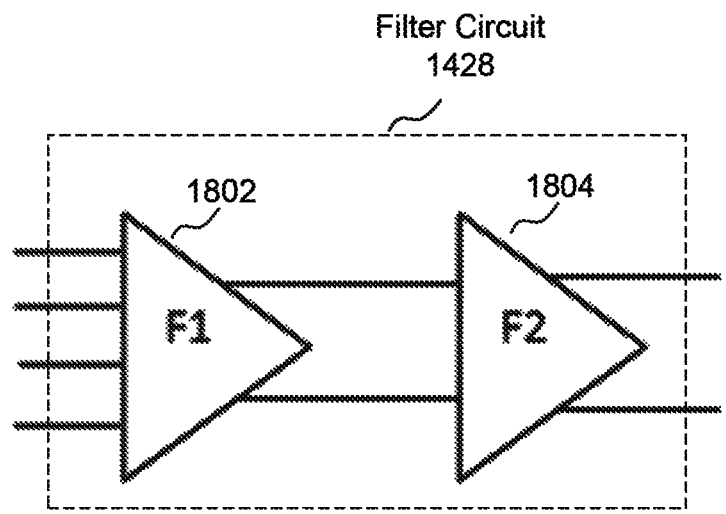
FIG. 18 illustrates an exemplary circuit diagram of filter circuit 1428, according to an embodiment of the present teaching.

FIG. 18 illustrates an exemplary circuit diagram of filter circuit 1428, according to an embodiment of the present teaching. Filter circuit 1428 as illustrated in FIG. 14 may comprise a first filter (F1) 1802 and a second filter (F2) 1804. First filter (F1) 1802 is configured to apply a first stage addition to each of two pairs of signals {P2A, P2B} and {N2A, N2B} that are outputted from sample-and-hold circuit 1426, It is to remove the deviation signals. First filter (F1) 1802 may be further configured to perform a first stage gain amplifying on the signals after the first stage addition processing. Second filter (F2) 1804 is configured to apply a second stage addition and/or a second stage gain amplifying on the output signals from first filter (F1) 1802 and generate the third pair of differential signals {P3, N3}. The gain of first filter (F1) 1802 may be configured to be smaller than the gain of second filter (F2) 1804. For example, the gain of first filter (F1) 1802 is 4 and the gain of second filter (F2) 1804 is 8.

It should be appreciated that the diagram of the filter circuit 1428 described above is for illustrative purpose. The present teaching is not intended to be limiting. Filter circuit 1428 may comprise more or less filters than what is illustrated in FIG. 18. In some embodiments, filter circuit 1428 may comprise only one filter. However, in this situation, the only filter may have to be configured with a large resistance in order to achieve a better gain.

Figure 19:
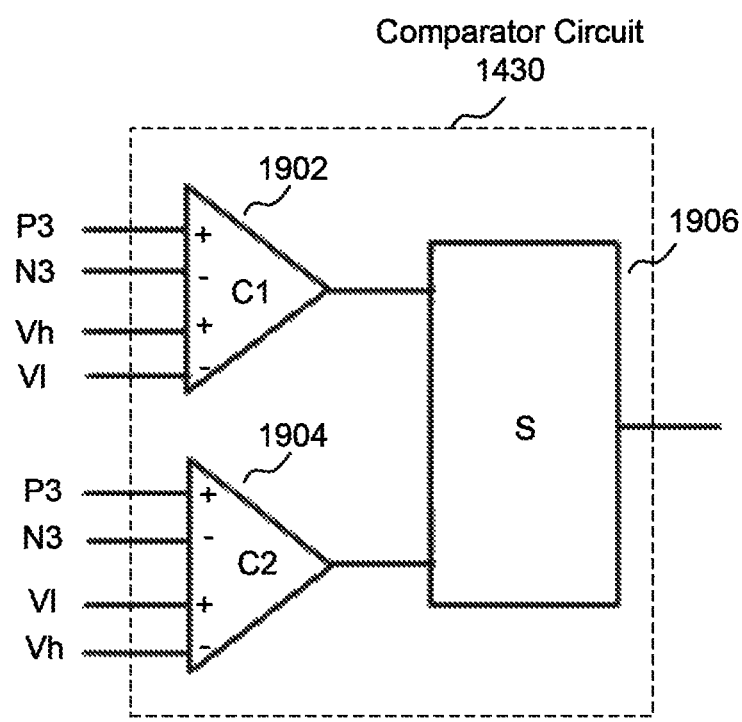
FIG. 19 illustrates an exemplary circuit diagram of comparator circuit 1430, according to an embodiment of the present teaching.

FIG. 19 illustrates an exemplary circuit diagram of comparator circuit 1430, according to an embodiment of the present teaching. Comparator circuit 1430 of FIG. 14 may perform the same function as A/D conversion element 1114 of FIG. 11. In this embodiment, comparator circuit 1430 may be a delay comparator including a first comparator (C1) 1902, a second comparator (C2) 1904, and a latch logic circuit (S) 1906. The input to first comparator (C1) 1902 includes the third pair of differential signals {P3, N3} and a pair of reference voltage signals {Vh, Vl}, where Vh is a high voltage signal and Vl is a low voltage signal. The input to second comparator (C2) 1904 includes the same pairs of signals that are input to first comparator (C1) 1902 except that the pair of reference voltage signals {Vh, Vl} is connected in opposite polarities. First comparator (C1) 1902 is configured to compute an output voltage Vl from filter 1408, wherein Vl=P3−N3, and a high voltage threshold Rh, wherein Rh=Vh−Vl. First comparator (C1) 1902 compares the output voltage Vl with the high voltage threshold Rh. When Vl>Rh, first comparator (C1) 1902 outputs high and when Vl<Rh, first comparator (C1) 1902 outputs low. Second comparator (C2) 1904 is configured to compare output voltage Vl from filter 1408 with a low voltage threshold Rl, wherein Rl=Vl−Vh. When Vl>Rl, second comparator (C2) 1904 outputs high and when Vl<Rl, second comparator (C2) 1904 outputs low. As Rh is greater than Rl, when Vl>Rh, which means that Vl>Rl, both first comparator (C1) 1902 and second comparator (C2) 1904 output high. When Vl<Rl, which means that Vl<Rh, both first comparator (C1) 1902 and second comparator (C2) 1904 output low. When Rl<Vl<Rh, first comparator (C1) 1902 outputs low and second comparator (C2) 1904 outputs high. The comparison results from first comparator (C1) 1902 and second comparator (C2) 1904 are sent to latch logic circuit (S) 1906. Latch logic circuit (S) 1906 is configured to generate a voltage signal based on the comparison results. The voltage signal is further sent to output control circuit 1406 to control the operation status of the magnetic sensor. Details on how latch logic circuit (S) 1906 generates a voltage signal based on the comparison results are described below.

Figure 20:
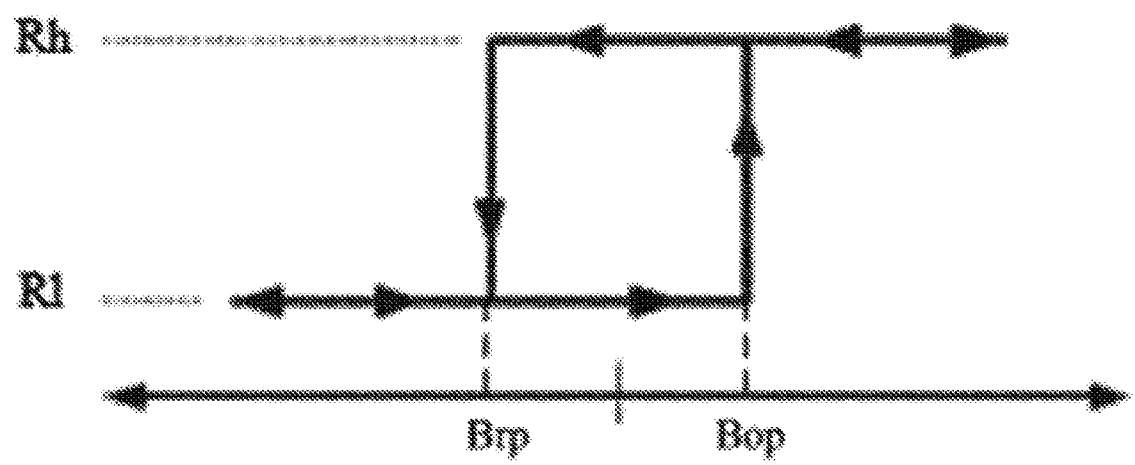
FIG. 20 illustrates an exemplary schematic diagram for determining the polarity of the magnetic field.

FIG. 20 illustrates an exemplary schematic diagram for determining the polarity of the magnetic field, according to an embodiment of the present teaching. When latch logic circuit (S) 1906 receives the comparison results from first comparator (C1) 1902 and second comparator (C2) 1904, which indicate that the output voltage of filter circuit 1428 Vl is greater than Rh, latch logic circuit (S) 1906 generates a first signal indicating a change to sink current state. When latch logic circuit (S) 1906 receives the comparison results from first comparator (C1) 1902 and second comparator (C2) 1904, which indicate that the output voltage of filter circuit 1428 is less than Rl, latch logic circuit (S) 1906 generates a second signal indicating a change to source current state. When latch logic circuit (S) 1906 receives the comparison results from first comparator (C1) 1902 and second comparator (C2) 1904, which indicate that the output voltage of filter circuit 1428 Vl satisfies Rl<Vl<Rh, latch logic circuit (S) 1906 generates a third signal indicating no change to the state. In some embodiments, the first voltage indicates that the external magnetic field exhibits a first polarity, and the second voltage indicates that the external magnetic field exhibits a second polarity.

FIG. 20 illustrates that in some embodiments, when the magnetic field strength of the external magnetic field reaches a working point Bop, comparator circuit 1430 generates the first signal, while when the magnetic field strength of the external magnetic field is below a releasing point Brp, comparator circuit 1430 generates the second signal. When the magnetic field strength of the external magnetic field is between the working point Bop and the releasing point Brp, comparator circuit 1430 remains the current output without change.

Figure 21:
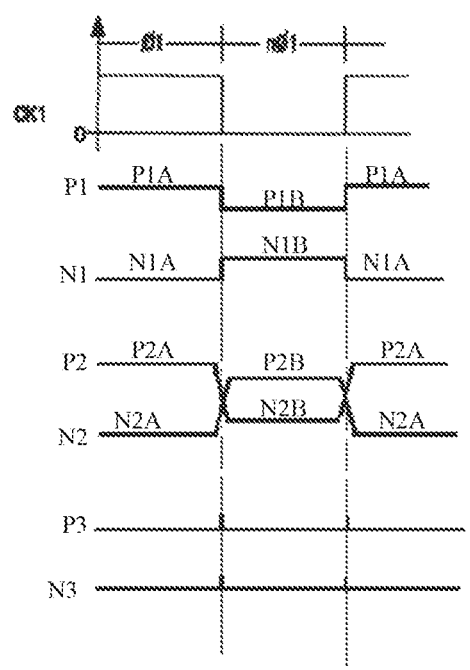
FIG. 21 illustrates exemplary signal outputs in a clock cycle.
Figure 21:
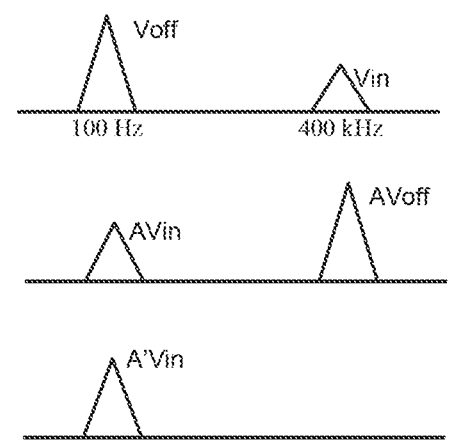

FIG. 21 illustrates exemplary signal outputs in a clock cycle, according to an embodiment of the present teaching. As shown in FIG. 21 (A), the first pair of differential signals {P1, N1} is the output of first chopper switch 1422, the second pair of differential signals {P2, N2} is the output of first chopper amplifier 1424, and the third pair of differential signals {P3, N3} is the output of filter circuit 1428. {P1A, N1A} is a pair of differential signals outputted from first chopper switch 1422 during the first half of the clock cycle, and {P1B, N1B} is a pair of differential signals outputted from first chopper switch 1422 during the second half of the clock cycle. {P2A, N2A} is a pair of differential signals outputted from first chopper amplifier 1424 during the first half of the clock cycle, and {P2B, N2B} is a pair of differential signals outputted from first chopper amplifier 1424 during the second half of the clock cycle.

As described above, Vout denotes the output of first chopper switch 1422, which is the actual magnetic field voltage signal Vin or −Vin superimposed by deviation signal Vos. In another aspect, Vout denotes the difference between the first pair of differential signals {P1, N1}, where P1 and N1 have the same amplitude and opposite polarity. Therefore, P1A, P1B, N1A, and N1B are denoted by the following equations:

$$\begin{cases} P1A = \dfrac{Vos + Vin}{2} \\ P1B = \dfrac{Vos - Vin}{2} \\ N1A = -P1A = -\dfrac{Vos + Vin}{2} \\ N1B = -P1B = -\dfrac{Vos - Vin}{2} \end{cases} \quad (1)$$

When first chopper amplifier 1424 in FIG. 14 implements the embodiment illustrated in FIG. 13B, first chopper amplifier 1424 comprises a first amplifier (A1) 1302, a second chopper switch (Z2) 1304, and a second amplifier (A2) 1306. The first pair of differential signals {P1, N1} is amplified to differential signals {P1, N1 '} after passing through first amplifier (A1) 1302. {P1, N1'} and their respective components during the first half and the second half of the clock cycle are denoted by the following equations:

$$\begin{cases} P1A' = A\dfrac{Voff + Vin}{2} \\ P1B' = A\dfrac{Voff - Vin}{2} \\ N1A' = -P1A' = -A\dfrac{Voff + Vin}{2} \\ N1B' = -P1B' = -A\dfrac{Voff - Vin}{2} \end{cases} \quad (2)$$

A denotes the amplifying gain of first amplifier (A1) 1302. Voff denotes the deviation signal outputted by first amplifier (A1) 1302, which includes the deviation signal generated by Hall detector 1420 Vos and the deviation signal generated by first amplifier (A1) 1302. For illustrative purpose, coefficients A and ½ are ignored from the description herein below.

As second chopper switch (Z2) 1304 directly outputs the amplified differential signal {P1, N1} on the first half of a clock cycle, and switchingly outputs the amplified differential signal {P1, N1} on the second half of the clock cycle, the outputs from second chopper switch (Z2) 1304 comprise two components at each half of the clock cycle. After passing through sample-and-hold circuit 1426, the four components {P2A, P2B, N2A, N2B} denoted by the following equations are inputted to filter circuit 1428.

$$\begin{cases} P2A = P1A' = Voff + Vin \\ P2B = N1B' = -(Voff - Vin) \\ N2A = N1A' = -(Voff + Vin) \\ N2B = P1B' = Voff - Vin \end{cases} \quad (3)$$

Further, the third pair of differential signals {P3, N3} outputted by filter circuit 1428 are denoted by the following equations:

$$\begin{cases} P3 = P2A + P2B = (Voff + Vin) - (Voff - Vin) = 2Vin \\ N3 = N2A + N2B = -Voff + Vin) + (Voff - Vin) = -2Vin \end{cases} \quad (4)$$

As shown in the above equations, the deviation signals in the third pair of differential signals {P3, N3} are removed by filter circuit 1428. The third pair of differential signals {P3, N3} thus, comprises only the actual magnetic field voltage signal.

FIG. 21 (B) shows that after the first chopper switch (e.g., 1202 in FIG. 12), the actual magnetic field voltage signal Vin and the deviation signal Voff are separated to a chopper frequency of 400 kHz and a baseband frequency of 100 Hz, respectively, where the chopper frequency is the frequency of the clock signal. After the second chopper switch (e.g., 1304 in FIG. 13A, 13B), the actual magnetic field voltage signal Vin and the deviation signal Voff are switched to the baseband frequency and the chopper frequency, respectively. Then after the filter circuit (e.g., 1206 in FIG. 12), the deviation signal Voff is filtered out. When the magnetic sensor is implemented to control a synchronous motor, the external magnetic field may be a permanent magnetic motor field in which, the polarity changing frequency is twice the AC power source frequency. If the synchronous motor is provided with the city AC power supply of 50 Hz or 60 Hz, the baseband frequency is 100 Hz or 120 Hz. After passing through multiple chopper switches and amplifiers, the actual magnetic field voltage signal and the deviation signal are separated in a very wide frequency range. As such, chopper amplifier implemented in the present teaching is configured to accommodate the very wide frequency range.

Figure 22:
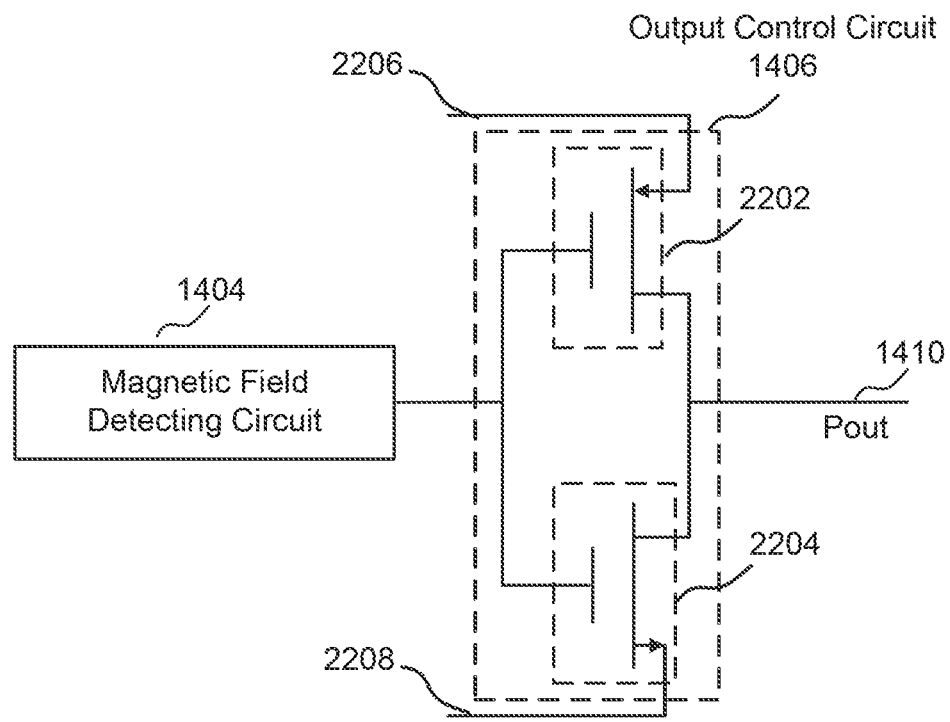
FIG. 22 illustrates an exemplary circuit diagram of the output control circuit 1406, according to an embodiment of the present teaching.

FIG. 22 illustrates an exemplary circuit diagram of the output control circuit 1406, according to an embodiment of the present teaching. Output control circuit 1406 according to the illustrated embodiment comprises a first switch 2202 and a second switch 2204. First switch 2202 is coupled with output port 1410 to form a first current path, and second switch 2204 is coupled with output port 1410 to form a second current path. The electric current flows through the first and the second current paths in opposite directions. First switch 2202 and second switch 2204 are controlled by magnetic detecting signal to be selectively connected. In some embodiments, first switch 2202 is a transistor, and second switch 2204 is either a diode or a transistor.

In some embodiments, first switch 2202 is configured as low-voltage pass and second switch 2204 is configured as high-voltage pass. The control ends of both first switch 2202 and second switch 2204 are connected to the output of magnetic detecting circuit 1404. The output of first switch 2202 and the input of the second switch 2204 are both connected to output port 1410. The input of first switch 2202 may be connected to a high-voltage end 2206, for example, a DC power source or the output VDD from rectifier circuit 1402, and the output of second switch 2204 may be connected to a low-voltage end 2208, for example, a ground. If the output of magnetic detecting circuit 1404 is a low voltage signal, first switch 2202 is connected and second switch 2204 is disconnected. Consequently, a load current flows into first switch 2202 from high-voltage end 2206 and flows out via output port 1410. If the output of magnetic detecting circuit 1404 is a high voltage signal, second switch 2204 is connected and first switch 2202 is disconnected. Consequently, a load current flows into second switch 2204 from output port 1410 and flows out via low-voltage end 2208.

Figure 23:
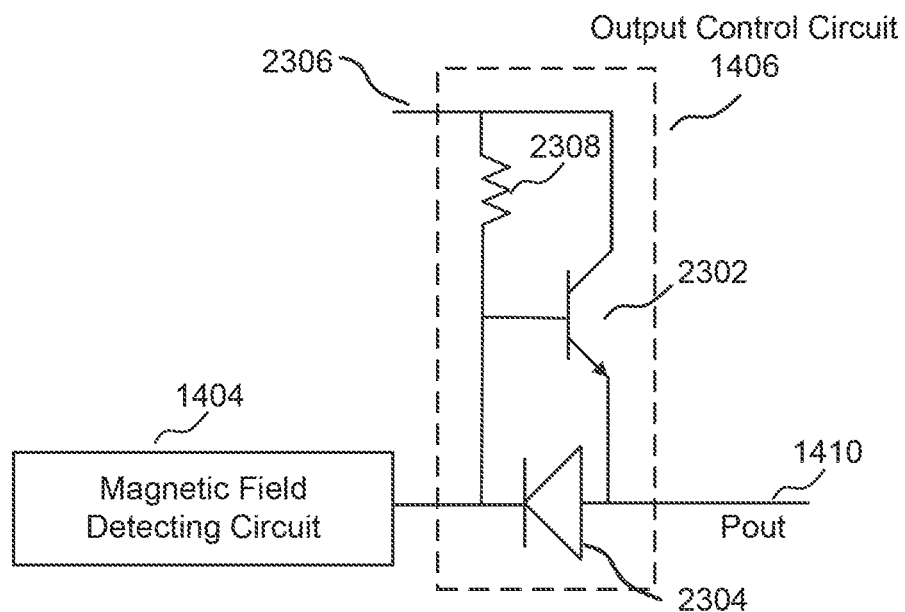
FIG. 23 illustrates an exemplary circuit diagram of the output control circuit, according to another embodiment of the present teaching.

FIG. 23 illustrates an exemplary circuit diagram of the output control circuit, according to another embodiment of the present teaching. Output control circuit 1406 according to the illustrated embodiment comprises first switch 2302 and second switch 2304. First switch 2302 is configured as be high-voltage pass, and second switch 2304 is configured to be a one-way diode. The control end of first switch 2302 and the cathode of second switch 2304 are both connected to the output of magnetic detecting circuit 1404. In some embodiments, the control end of first switch 2302 is connected to the output of magnetic detecting circuit 1404 via a resistance 2308. The input of first switch 2302 may be connected to the output of rectifier circuit 1402 (referring to FIG. 14). The output of first switch 2302 and the anode of the second switch are both connected to output port 1410. Similar to the embodiment illustrated in FIG. 22, first switch 2302 is coupled with output port 1410 to form a first current path, and second switch 2304 is coupled with output port 1410 to form a second current path. The electric current flows through the first and the second current paths in opposite directions. If the output of magnetic detecting circuit 1404 is a high voltage signal, first switch 2302 is connected and second switch 2304 is disconnected. Consequently, a load current flows into first switch 2302 from high-voltage end 2306 and flows out via output port 1410. If the output of magnetic detecting circuit 1404 is a low voltage signal, second switch 2304 is connected and first switch 2302 is disconnected. Consequently, a load current flows into second switch 2304 from output port 1410.

Figure 24:
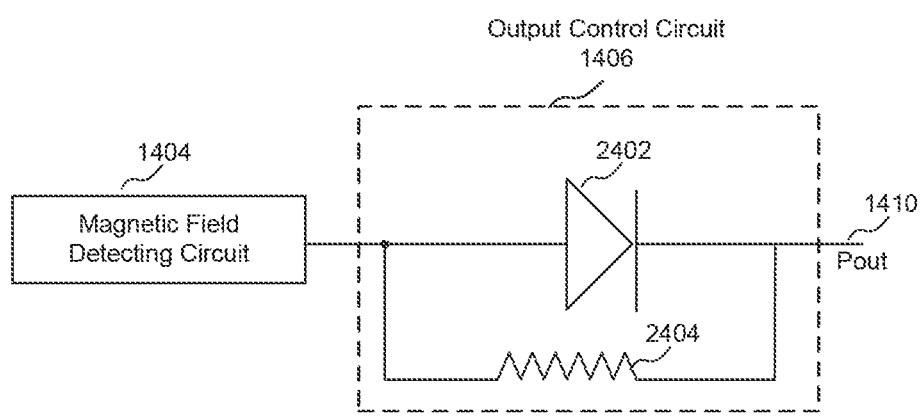
FIG. 24 illustrates an exemplary circuit diagram of the output control circuit, according to yet another embodiment of the present teaching.

FIG. 24 illustrates an exemplary circuit diagram of the output control circuit, according to yet another embodiment of the present teaching. Output control circuit 1406 according to the illustrated embodiment comprises a one-way switch 2402 and a resistance 2404. One-way switch 2402 is connected between magnetic field detecting circuit 1404 and output port 1410 to form a first current path, and resistance 2404 is connected between magnetic field detecting circuit 1404 and output port 1410 to form a second current path, where the electric current flows through the first and the second current paths in opposite directions. If the output of magnetic detecting circuit 1404 is a high voltage signal, one-way switch 2402 is connected and a load current flows through one-way switch 2402 from the output of magnetic field detecting circuit 1404 to output port 1410. If the output of magnetic detecting circuit 1404 is a low voltage signal, one-way switch 2402 is disconnected and a load current flows through resistance 2404 from output port 1410 to the output of magnetic field detecting circuit 1404.

The magnetic sensor in the present teaching may be directly connected to the city AC power supply with no need of additional A/D converting equipment. Therefore, the present teaching facilitates the implementation of the magnetic sensor into various fields. Further, the magnetic field detecting circuit can effectively amplify the detected magnetic field signal, regulate the voltage and filter interference signals. Therefore, the magnetic sensor can generate more accurate signal with respect to the polarity of the external magnetic field to control the operation of the electric rotor.

Figure 25:
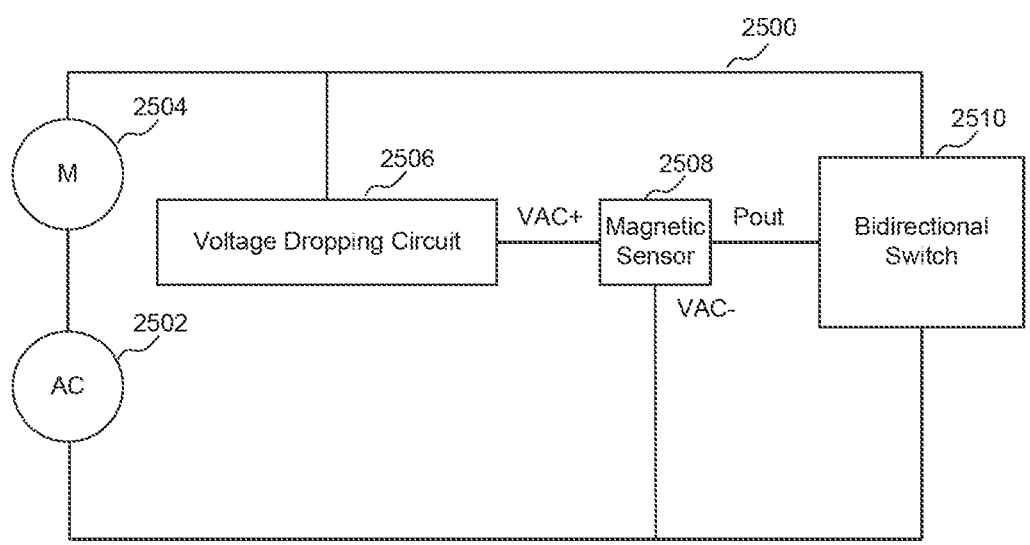
FIG. 25 illustrates an exemplary schematic diagram of an motor 2500 which incorporates a magnetic sensor constructed in accordance with the present teaching.

FIG. 25 illustrates an exemplary schematic diagram of a motor 2500 which incorporates a magnetic sensor constructed in accordance with the present teaching. The motor may comprise an AC power supply 2502, a motor 2504, a magnetic sensor 2508, and a bidirectional switch 2510. In some embodiments, the motor 2500 may further comprise a voltage dropping circuit 2506 configured to reduce the level of AC power supply 2502 before providing to magnetic sensor 2508. The output Pout of Magnetic sensor 2508 is electrically connected to a control end of bidirectional switch 2510.

In some embodiments, magnetic sensor 2508 is configured to output a driving current to bidirectional switch 2510 when AC power supply 2502 operates at a positive half cycle and when magnetic field detecting circuit 1404 in magnetic sensor 2508 determines that the external magnetic field exhibits a first polarity. In the alternative, output control circuit 1406 in magnetic sensor 2508 is configured to control magnetic sensor 2508 to output a driving current to bidirectional switch 2510 when AC power supply 2502 operates at a negative half cycle and magnetic field detecting circuit 1404 therein determines that the external magnetic field exhibits a second polarity opposite to the first polarity. Output control circuit 1406 in magnetic sensor 2508 is further configured to control magnetic sensor 2508 not to output a driving current to bidirectional switch 2510 when AC power supply 2502 operates at a negative half cycle and magnetic field detecting circuit 1404 therein determines that the external magnetic field exhibits a first polarity, or when AC power supply 2502 operates at a positive half cycle and magnetic field detecting circuit 1404 determines that the external magnetic field exhibits a second polarity.

In the embodiments where magnetic sensor 2508 uses a rectifier circuit as illustrated in FIG. 15 and an output control circuit as illustrated in FIG. 22, the input of first switch 2202 of FIG. 22 is configured to connect to the voltage output VDD of bridge full waver rectifier of FIG. 15, and the output of second switch 2204 is configured to connect to ground. When AC power supply 2502 operates at a positive half cycle and magnetic field detecting circuit 1404 outputs a low voltage, first switch 2202 is connected and second switch is disconnected, an electric current flows in a direction passing through AC power supply 2502, motor 2504, VAC+, magnetic sensor 2508, and bidirectional switch 2510. Within magnetic sensor 2508, the electric current flows through the voltage output of bridge full waver rectifier and first switch 2202. In some embodiments, the electric current flows through voltage dropping circuit 2506 before magnetic sensor 2508. When AC power supply 2502 operates at a negative half cycle and magnetic field detecting circuit 1404 outputs a high voltage, first switch 2202 is disconnected and second switch is connected, an electric current flows in an opposite direction passing through AC power supply 2502, bidirectional switch 2510, magnetic sensor 2508, and motor 2504. Within magnetic sensor 2508, the electric current flows through second switch 2204, ground output of bridge full waver rectifier, first diode 1502 and VAC+. When AC power supply 2502 operates at a positive half cycle and magnetic field detecting circuit 1404 outputs a high voltage, or when AC power supply 2502 operates at a negative half cycle and magnetic field detecting circuit 1404 outputs a low voltage, first switch 2202 and second switch 2204 are both disconnected. Consequently, there is no driving current flowing through Pout of magnetic sensor 2508.

Figure 26:
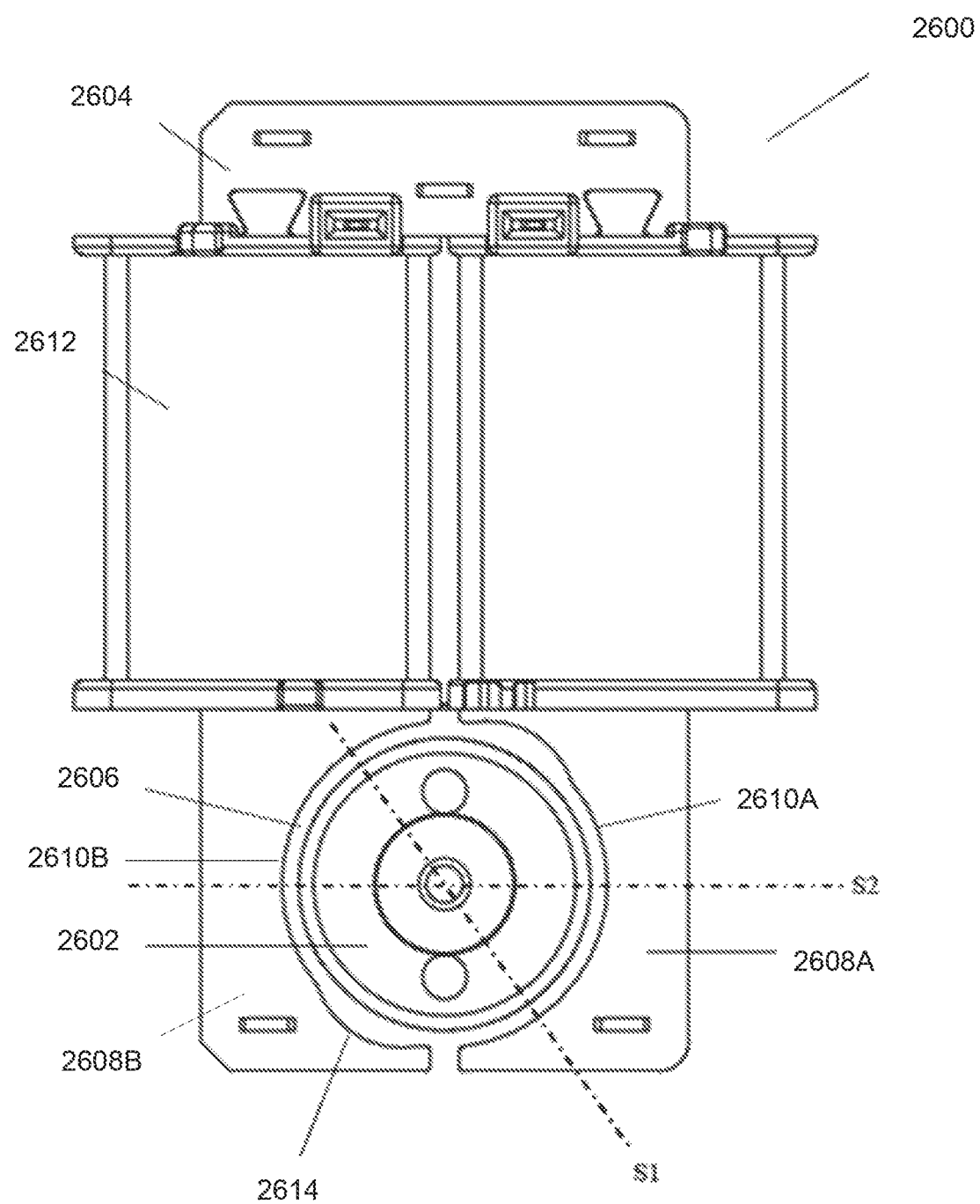
FIG. 26 illustrates an exemplary schematic diagram of a synchronous motor 2600 which incorporates a magnetic sensor constructed in accordance with the present teaching.

FIG. 26 illustrates an exemplary schematic diagram of a synchronous motor 2600 which incorporates a magnetic sensor constructed in accordance with the present teaching. Synchronous motor 2600 comprises a stator and a rotor 2602 configured to rotate relative to the stator. The stator comprises a stator core 2604 and a stator coil 2612 configured to wind around stator core 2604. Stator core 2604 may be made of any soft magnetic materials such as iron, cast iron, electrical steel, silicon, etc. Rotor 2602 is configured to rotate at a constant speed of 60 f/p (i.e., revolutions per minute, rpm) when connecting to an AC power supply in serial, where f is the frequency of the AC power supply and p is number of pole pairs in rotor 2602.

Stator core 2604 is configured with a pair of opposing pole portions 2608A and 2608B. Each of the pair of opposing pole portions (2608A, 2608B) has a pole arc surface, for example, 2610A and 2610B. The surface of rotor 2602 opposes the pole arc surfaces (2610A, 2610B) and forms an air gap 2606 in between. In some embodiments, the air gap 2606 between rotor 2602 and the stator is mostly even with very little uneven gap area. In some embodiments, each of pole surfaces (2610A, 2610B) is further configured with a starting groove, for example, 2614. Pole arc surfaces (2610A, 2610B) are concentric with rotor 2602 except the area of starting grooves. The configuration of starting grooves forms an uneven magnetic field internally. Further, the configuration of starting grooves ensure that when rotor 2602 is static, a polar S1 of rotor 2602 is tilted to an angle relative to a central polar S2 of pole portions 2608A and 2608B. Such configuration allows the rotor 2602 to have a starting torque each time the motor is turned on. In this embodiment, polar S1 of rotor 2602 is a separation boundary between two magnetic poles of rotor 2602, and central polar S2 passes through the opposing pole portions 2608A and 2608B in the center. The stator and rotor 2602 are both configured with two magnetic poles.

Output control circuit 1406 according to the present teaching controls bidirectional switch 2510 to switch the status between connecting and disconnecting based on the polarity of AC power supply 2502 and the polarity of the external magnetic field, and further controls the power-up status of stator coil 2612. As such, the magnetic field generated by the stator can coordinate with the magnetic field position of rotor 2602 to drive the rotor to rotate in one single direction, and therefore, ensures the motor to have a constant rotating direction each time the motor is powered up.

It should be appreciated that the examples described above are for illustrative purpose. The present teaching is not intended to be limiting. The stator and rotor 2602 may be configured with different magnetic poles, such as four or six magnetic poles. In addition, the stator and rotor 2602 may have different magnetic poles with respect to each other.

Those skilled in the art will recognize that the present teachings are amenable to a variety of modifications and/or enhancements. For example, although the implementation of various components described above may be embodied in a hardware device, it can also be implemented as a software only solution—e.g., an installation on an existing server. In addition, the units of the host and the client nodes as disclosed herein can be implemented as a firmware, firmware/software combination, firmware/hardware combination, or a hardware/firmware/software combination.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

We claim:

1. An integrated circuit for a magnetic sensor, comprising:
an input port to be connected to an external power supply;
an output port; and
a magnetic field detecting circuit configured to generate a magnet detection signal and comprising:
  a magnetic sensing element configured to detect an external magnetic field and output a detection signal, wherein the detection signal includes a magnetic field signal and a deviation signal,
  a signal processing element configured to amplify the detection signal and remove interference to generate a processed detection signal, and
  a conversion element configured to convert the processed detection signal to the magnet detection signal, which is used to control the magnetic sensor to operate in at least one of a first state and a second state responsive to at least the magnet detection signal,
wherein the signal processing element comprises
  a first chopper switch configured to separate the detection signal into a magnetic field signal and a deviation signal corresponding to a chopper frequency and a baseband frequency, respectively;
  a chopper amplifier configured to separately amplify the magnetic field signal and the deviation signal and switch the amplified deviation signal and the amplified magnetic field signal onto the chopper frequency and the baseband frequency, respectively, and
  a filter circuit configured to remove the deviation signal that has been switched to the chopper frequency.

2. The integrated circuit for a magnetic sensor of claim 1, further comprising a rectifying circuit coupled with the input port, wherein the rectifying circuit provides voltage supply to the magnetic field detection circuit.

3. The integrated circuit for a magnetic sensor of claim 1, wherein the chopper amplifier comprises:
a first amplifier; and
a second chopper switch, wherein
  the first amplifier is configured to perform first-stage amplification on the deviation signal and the magnetic field signal from the first chopper switch to generate the amplified deviation signal and the amplified magnetic field signal, respectively, and the second chopper switch is configured to switch the amplified deviation signal and the amplified magnetic field signal onto the chopper frequency and the baseband frequency, respectively.

4. The integrated circuit for a magnetic sensor of claim 3, wherein the chopper amplifier further comprises a second amplifier connected in serial to the second chopper switch, wherein the second amplifier is configured to perform second-stage amplification on the amplified deviation signal switched onto the chopper frequency and the amplified magnetic field signal switched onto the baseband frequency.

5. The integrated circuit for a magnetic sensor of claim 4, wherein the conversion element further comprises:
   a first comparator configured to compare an output voltage determined based on the third pair of differential signals with a high-voltage threshold;
   a second comparator configured to compare the output voltage determined based on the third pair of differential signals with a low-voltage threshold; and
   a latch logic circuit configured to output a first voltage if the output voltage is greater than the high-voltage threshold or a second voltage if the output voltage is less than the low-voltage threshold, or to maintain the output of the conversion element if the output voltage is between the low-voltage threshold and the high-voltage threshold, wherein the high-voltage threshold and the low-voltage threshold are determined based on the pair of differential voltage references.

6. The integrated circuit for a magnetic sensor of claim 4, further comprising:
   an output control circuit configured to control the magnetic sensor to operate in at least one of the first state and the second state based on the magnet detection signal,
   wherein the output control circuit comprises:
      a first switch coupled with the output port to form a first current path allowing the load current flows from the output port to outside of the magnetic sensor in the first state; and
      a second switch coupled with the output port to form a second current path allowing the load current flows from outside of the magnetic sensor to the output port in the second state, wherein
      the first and second switches operate based on the magnet detection signal to selectively turn on the first and second current paths.

* * * * *